United States Patent
Yaegashi

(10) Patent No.: US 8,723,246 B2
(45) Date of Patent: *May 13, 2014

(54) NONVOLATILE SEMICONDUCTOR MEMORY AND MANUFACTURING METHOD THEREOF

(75) Inventor: Toshitake Yaegashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

This patent is subject to a terminal disclaimer.

(21) Appl. No.: 13/487,342

(22) Filed: Jun. 4, 2012

(65) Prior Publication Data

US 2012/0238087 A1    Sep. 20, 2012

Related U.S. Application Data

(60) Continuation of application No. 13/047,015, filed on Mar. 14, 2011, now Pat. No. 8,211,767, which is a division of application No. 11/854,845, filed on Sep. 13, 2007, now Pat. No. 7,928,497.

(30) Foreign Application Priority Data

Sep. 20, 2006    (JP) ................................ 2006-254710

(51) Int. Cl.
    *H01L 29/788*    (2006.01)
(52) U.S. Cl.
    USPC ...................... 257/316; 257/319; 257/E29.17
(58) Field of Classification Search
    USPC ..................................... 257/316, 390, E29.17
    See application file for complete search history.

(56) References Cited

U.S. PATENT DOCUMENTS

| | | | |
|---|---|---|---|
| 6,265,739 B1 | 7/2001 | Yaegashi et al. | |
| 6,927,139 B2 | 8/2005 | Tanaka et al. | |
| 7,842,993 B2 | 11/2010 | Yaegashi | |
| 2004/0046206 A1* | 3/2004 | Yun et al. | 257/315 |
| 2005/0029579 A1 | 2/2005 | Mori | |
| 2005/0045966 A1 | 3/2005 | Yamashita et al. | |
| 2005/0184327 A1* | 8/2005 | Ozawa | 257/302 |
| 2006/0197226 A1 | 9/2006 | Matsui et al. | |
| 2006/0240619 A1* | 10/2006 | Ozawa et al. | 438/257 |
| 2007/0020957 A1 | 1/2007 | Mizushima et al. | |
| 2007/0196985 A1 | 8/2007 | Ozawa et al. | |
| 2009/0173989 A1 | 7/2009 | Yaegashi | |

FOREIGN PATENT DOCUMENTS

| | | |
|---|---|---|
| JP | 8-264667 | 10/1996 |
| JP | 10-154761 | 6/1998 |
| JP | 2000-174149 | 6/2000 |
| JP | 2006-196843 | 7/2006 |
| JP | 2006-310393 | 11/2006 |

* cited by examiner

*Primary Examiner* — Zandra Smith
*Assistant Examiner* — Jamie C Niesz
(74) *Attorney, Agent, or Firm* — Oblon, Spivak, McClelland, Maier & Neustadt, L.L.P.

(57) ABSTRACT

A nonvolatile semiconductor memory according to examples of the present invention comprises a memory cell and a peripheral transistor. The memory cell has a first intergate insulating film having a multilayer structure and provided on a floating gate electrode and an isolation insulating layer. The peripheral transistor has a second intergate insulating film having a multilayer structure and provided on a first gate electrode and a second isolation insulating layer. The first and second intergate insulating films have the same structure, and a lowermost insulating layer of the first intergate insulating film on the first isolation insulating layer is thinner than a lowermost insulating layer of the second intergate insulating film on the second isolation insulating layer.

16 Claims, 19 Drawing Sheets

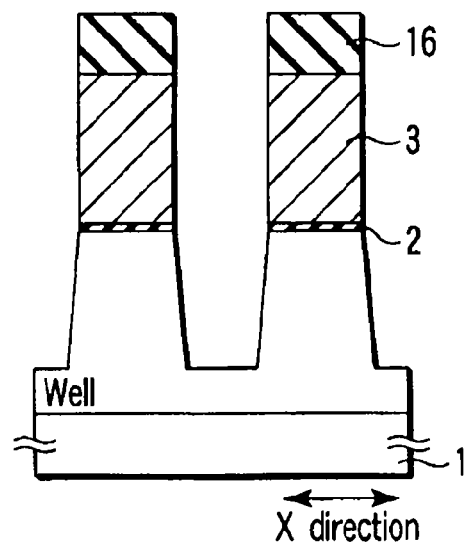
F I G. 12
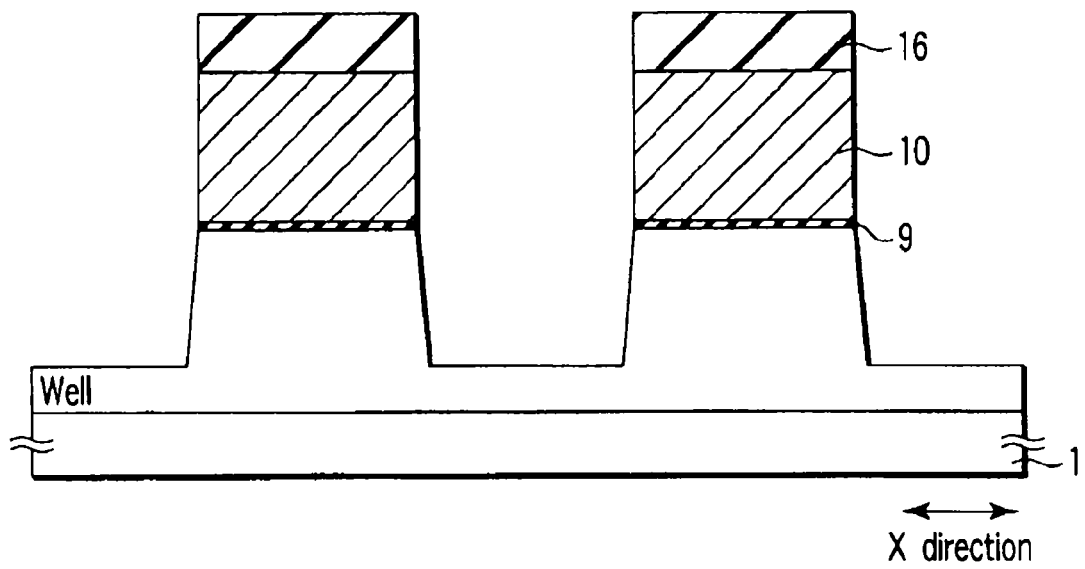
F I G. 13

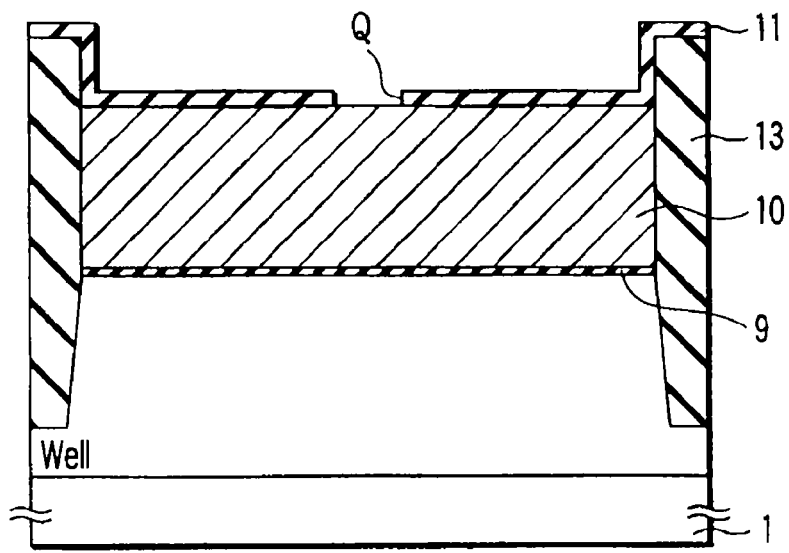
F I G. 16
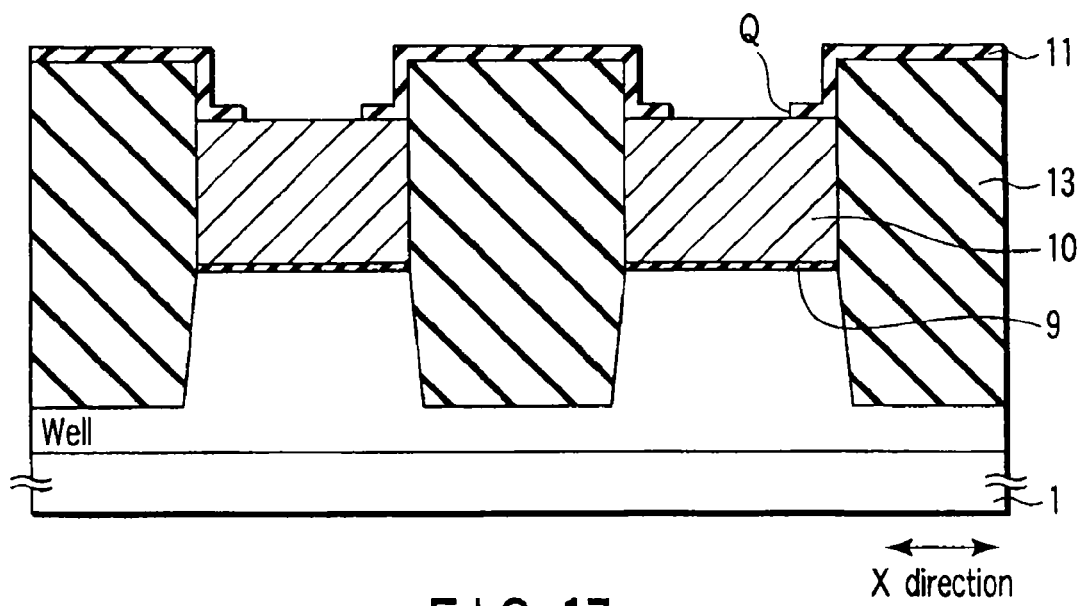
F I G. 17

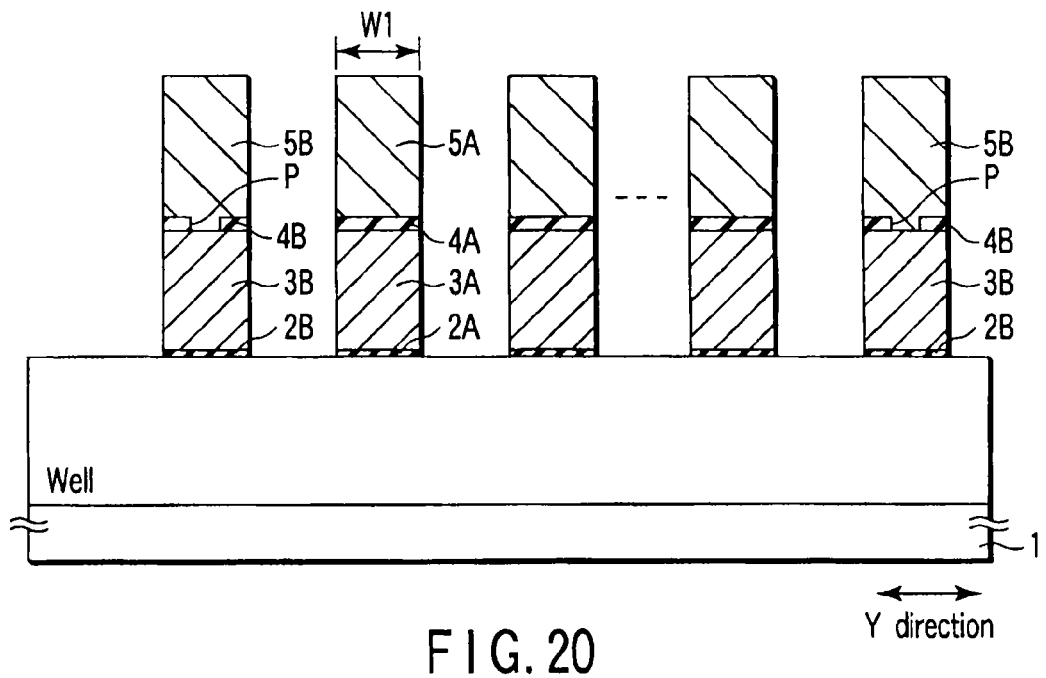
F I G. 20
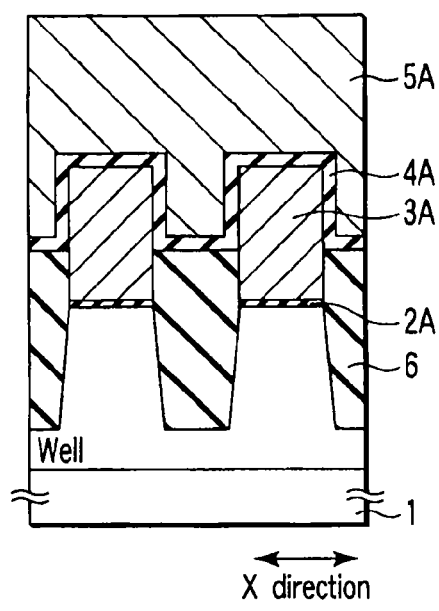
F I G. 21

NONVOLATILE SEMICONDUCTOR MEMORY AND MANUFACTURING METHOD THEREOF

CROSS-REFERENCE TO RELATED APPLICATIONS

This application is a continuation of and claims the benefit of priority under 35 U.S.C. §120 from U.S. application Ser. No. 13/047,015, filed Mar. 14, 2011, which is a divisional of U.S. application Ser. No. 11/854,845, filed Sep. 13, 2007, now U.S. Pat. No. 7,928,497 and claims the benefit of priority from prior Japanese Patent Application No. 2006-254710, filed Sep. 20, 2006, the entire contents of which are incorporated herein by reference.

BACKGROUND OF THE INVENTION

1. Field of the Invention

The present invention relates to a nonvolatile semiconductor memory and a method of manufacturing, and more particularly, it relates to the structure of intergate insulating films of a memory cell and a peripheral transistor.

2. Description of the Related Art

Nonvolatile semiconductor memories such as NAND type flash memories are nonvolatile and permit higher integration, and therefore, have recently been installed in various electronic devices.

As the structure of a memory cell of the NAND type flash memory, a gate electrode structure has been known in which a floating gate electrode and a control gate electrode are stacked via an intergate insulating film.

A stacked film (hereinafter, an ONO film) composed of a silicon oxide film, a silicon nitride film, and a silicon oxide film is often used for the intergate insulating film to improve the coupling ratio of the memory cell.

However, as the memory cells are increasingly miniaturized, an oxidizer in an oxidizing process carried out after the formation of the gate electrode diffuses into the silicon oxide films of the ONO film, and thus reacts with silicon films forming the floating gate electrode and the control gate electrode. As a result, bird's beaks produced from the silicon oxide films are formed at an interface between the ONO film and the floating gate electrode or the control gate electrode, which reduces the dielectric constant of the intergate insulating film and the coupling ratio of the memory cell.

An effective way to avoid this problem is to use, as the intergate insulating film, a film composed of a silicon nitride film, a silicon oxide film, a silicon nitride film, a silicon oxide film and a silicon nitride film (hereinafter, an NONON film) in which the silicon nitride films are further formed in the top and bottom layers of the ONO film.

However, the miniaturization of the memory cell causes another problem that inter-cell interference is induced by parasitic capacitance between the adjacent floating gate electrodes leading to a varied threshold voltage of the memory cell.

The cause of this problem is that the NONON film increases the parasitic capacitance between the adjacent floating gate electrodes due to its higher dielectric constant than that of the ONO film.

This aggravates the variation of a threshold voltage of the memory cell due to the inter-cell interference and degrades the performance of the memory cell.

On the other hand, an advantage of using the NONON film as the intergate insulating film is that the diffusion of elements forming a fixed charge into a semiconductor substrate can be suppressed and that the performance of the memory cell and of a peripheral transistor can be prevented from degrading.

BRIEF SUMMARY OF THE INVENTION

A nonvolatile semiconductor memory of an aspect of the present invention comprising: at least one memory cell and one peripheral transistor disposed on a semiconductor substrate, the memory cell having: a first gate insulating film provided in a first element area of the semiconductor substrate, the first element area being defined by a first isolation insulating layer provided on the semiconductor substrate; a floating gate electrode provided on the first gate insulating film; a first intergate insulating film having a multilayer structure and provided on the floating gate electrode and the isolation insulating layer; and a control gate electrode provided on the first intergate insulating film, the peripheral transistor having: a second gate insulating film provided in a second element area of the semiconductor substrate, the second element area being defined by a second isolation insulating layer provided on the semiconductor substrate; a first gate electrode provided on the second gate insulating film; a second intergate insulating film having a multilayer structure and provided on the first gate electrode and the second isolation insulating layer; and a second gate electrode provided on the second intergate insulating film, wherein the first and the second intergate insulating films have the same structure, and an insulating film serving as a lowermost layer of the first intergate insulating film on the first isolation insulating layer is thinner than an insulating film serving as a lowermost layer of the second intergate insulating film on the second isolation insulating layer.

A nonvolatile semiconductor memory of an aspect of the present invention comprising: at least one memory cell and one peripheral transistor disposed on a semiconductor substrate, the memory cell having: a first gate insulating film provided in a first element area of the semiconductor substrate, the first element area being defined by a first isolation insulating layer provided on the semiconductor substrate; a floating gate electrode provided on the first gate insulating film; a first isolation insulating layer provided in a first element isolation area of the semiconductor substrate; a first intergate insulating film having a multilayer structure and provided on the floating gate electrode and the isolation insulating layer; and a control gate electrode provided on the first intergate insulating film, the peripheral transistor having: a second gate insulating film provided in a second element area of the semiconductor substrate, the second element area being defined by a second isolation insulating layer provided on the semiconductor substrate; a first gate electrode provided on the second gate insulating film; a second intergate insulating film having a multilayer structure and provided on the first gate electrode and the second isolation insulating layer; and a second gate electrode provided on the second intergate insulating film, wherein an insulating film serving as a lowermost layer of the second intergate insulating film on the second isolation insulating layer is not disposed on the first isolation insulating layer.

A method of manufacturing a nonvolatile semiconductor memory of an aspect of the present invention comprising: forming a first and a second gate insulating film in a first and a second element area of a semiconductor substrate, respectively; forming a floating gate electrode material on the first gate insulating film and forming at the same time a first gate electrode material on the second gate insulating film; defining first and second element areas of the semiconductor substrate by forming first and second isolation insulating layers in the semiconductor substrate, respectively; forming a first intergate insulating film having a multilayer structure on the first isolation insulating layer and the floating gate electrode material and forming at the same time a second intergate insulating film having a multilayer structure on the second isolation insulating layer and the second gate electrode material; forming a control gate electrode material on the first intergate insulating film and forming at the same time a second electrode material on the second intergate insulating film; sequentially etching the control gate electrode material, the first intergate insulating film and the floating gate electrode material to form a stacked gate electrode of a memory cell, and sequentially etching at the same time the second gate electrode material, the second intergate insulating film and the first gate electrode material to form a stacked gate electrode of a peripheral transistor; after forming the stacked gate electrodes, by oxidizing process, reducing a thickness of insulating film serving as lowermost layer of the first intergate insulating film on the first isolation insulating layer thinner than a thickness of insulating film serving as a lowermost layer of the second intergate insulating film on the second isolation insulating layer.

BRIEF DESCRIPTION OF THE SEVERAL VIEWS OF THE DRAWING

FIG. 12 is a sectional view showing a manufacturing process in a first embodiment;
FIG. 13 is a sectional view showing a manufacturing process in the first embodiment;
FIG. 16 is a sectional view showing a manufacturing process in the first embodiment;
FIG. 17 is a sectional view showing a manufacturing process in the first embodiment;
FIG. 20 is a sectional view showing a manufacturing process in the first embodiment;
FIG. 21 is a sectional view showing a manufacturing process in the first embodiment.

DETAILED DESCRIPTION OF THE INVENTION

1. Outline

Embodiments of the present invention concern the structures of intergate insulating films of a memory cell and a peripheral transistor.

In the embodiments of the present invention, the intergate insulating film is formed of a continuous film having a multilayer structure such as a NONON film. In addition, a natural oxide film is interposed between the intergate insulating film and a floating gate electrode in some cases, but the natural oxide film is not included as a part of the intergate insulating film.

In such an intergate insulating film, the thickness of a lowermost film of the intergate insulating film on an isolation insulating layer of the memory cell is smaller than the thickness of a lowermost film of the intergate insulating film on the floating gate electrode, or the lowermost film of the intergate insulating film is not formed on the isolation insulating layer.

Furthermore, in the structure of the intergate insulating film of the peripheral transistor formed at the same time as the memory cell, the thickness of the lowermost film of the intergate insulating film on the isolation insulating layer of the memory cell is smaller than the thickness of the intergate insulating film formed on the isolation insulating layer of the peripheral transistor.

Because the lowermost film of the intergate insulating film is thin on the isolation insulating layer or not formed on the isolation insulating layer, parasitic capacitance between the floating gate electrodes adjacent in a row direction can be reduced.

Therefore, the amount of variation of a threshold voltage of the memory cell due to inter-cell interference can be reduced, and write characteristics of the memory cell can be improved.

On the other hand, in the peripheral transistor, the top of the isolation insulating layer and the top of the gate electrode are covered with the intergate insulating film of the peripheral transistor.

Thus, the diffusion of a fixed charge attributed to the intergate insulating film or to a film higher than the intergate insulating film can be suppressed.

It is therefore possible to prevent the characteristic deterioration of the peripheral transistor due to the diffusion of the fixed charge.

2. Embodiments

(1) First Embodiment (a) Structure

Figure 1:
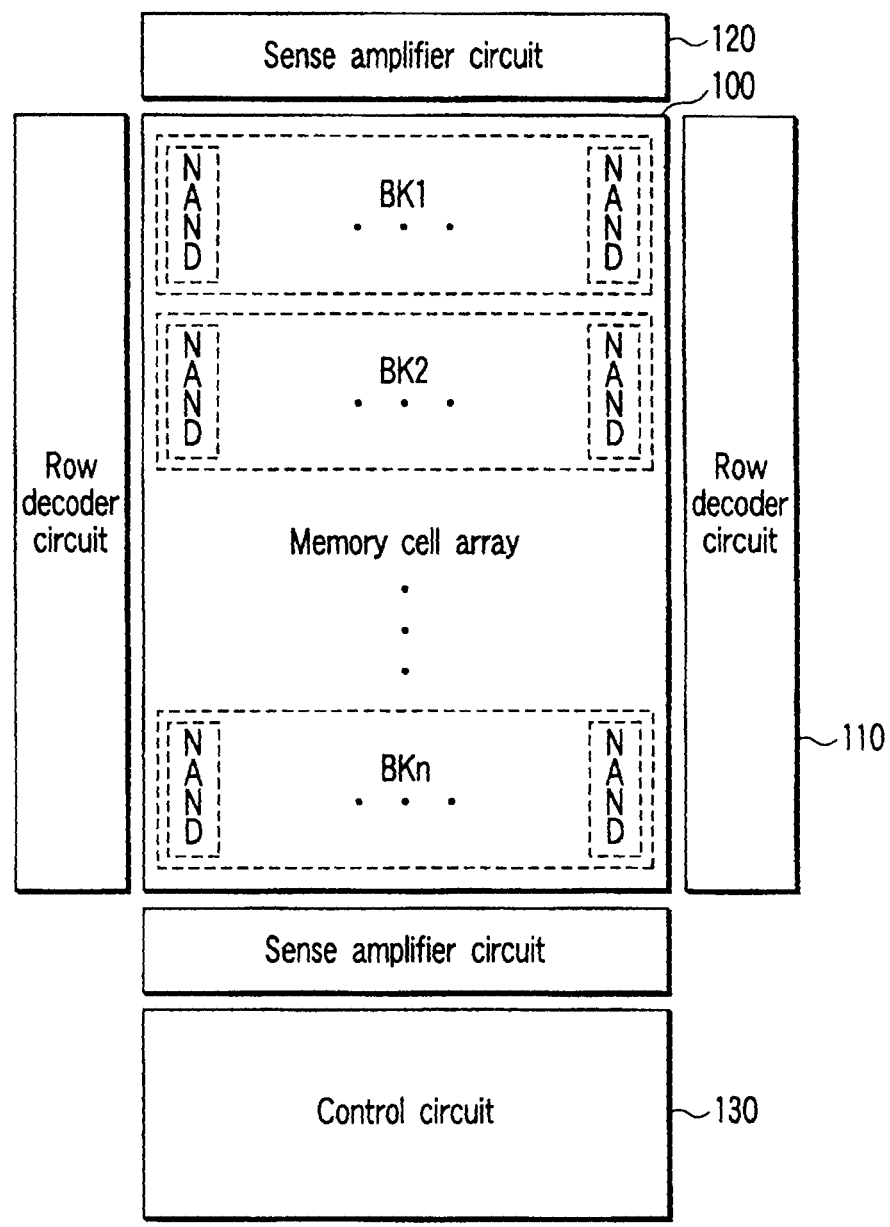
FIG. 1 is a diagram showing one example of the layout of a flash memory.

FIG. 1 shows one example of the layout of a flash memory in a first embodiment of the invention.

A flash memory comprises a memory cell array 100, and peripheral circuits disposed therearound such as a row decoder circuit 110, a sense amplifier circuit 120 and a control circuit 130.

For example, in the case of a NAND type flash memory, the memory cell array 100 comprises a plurality of blocks BK1, BK2, . . . , BKn, and each block further comprises a plurality of NAND cell units.

Figure 2:
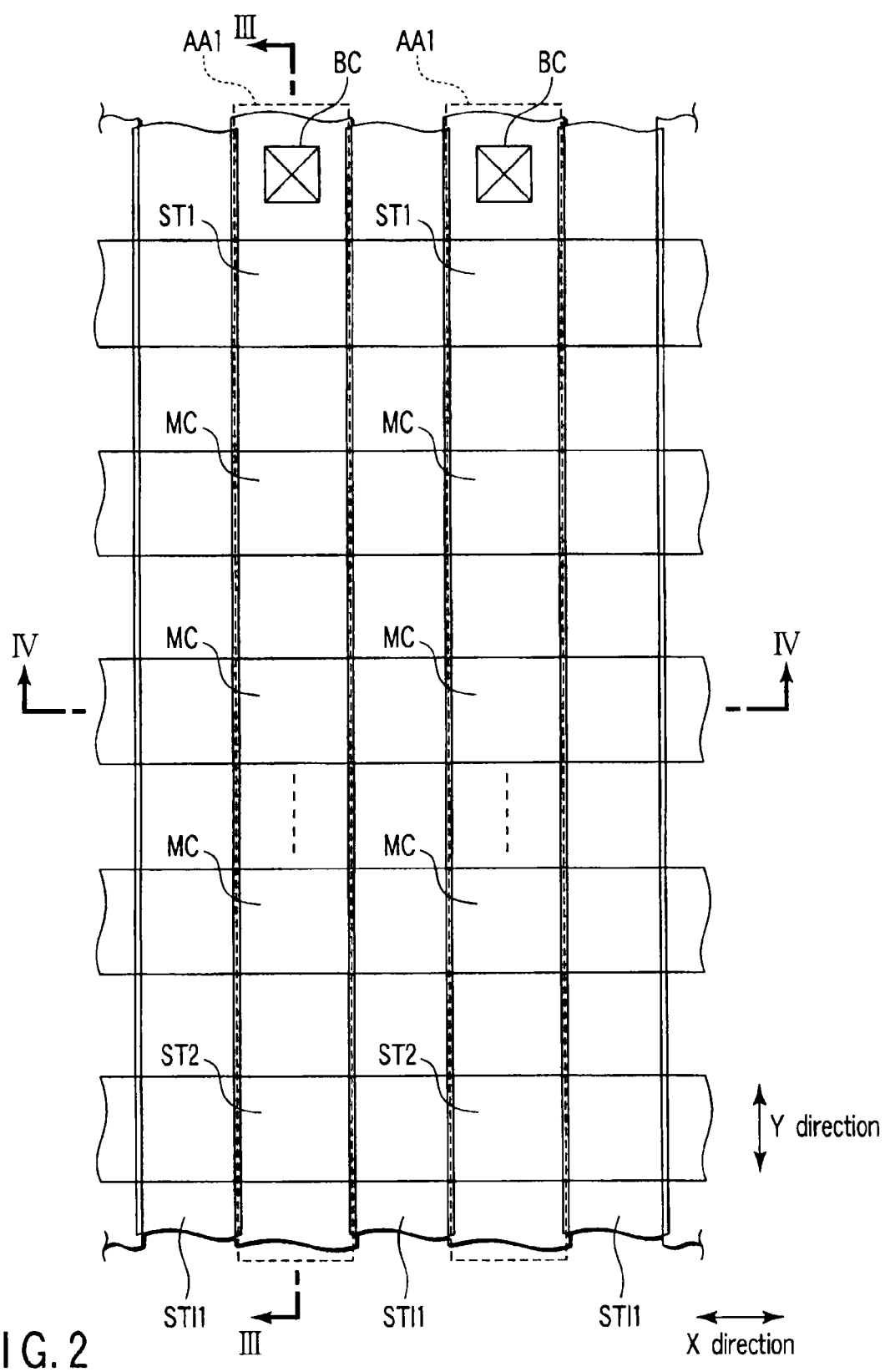
FIG. 2 is a plane view showing the structure of a memory cell array.

FIG. 2 shows a plane view of a part of the memory cell array 100. Further, FIG. 3 shows a sectional view along the III-III line in FIG. 2, and FIG. 4 shows a sectional view along the IV-IV line in FIG. 2.

Figure 3:
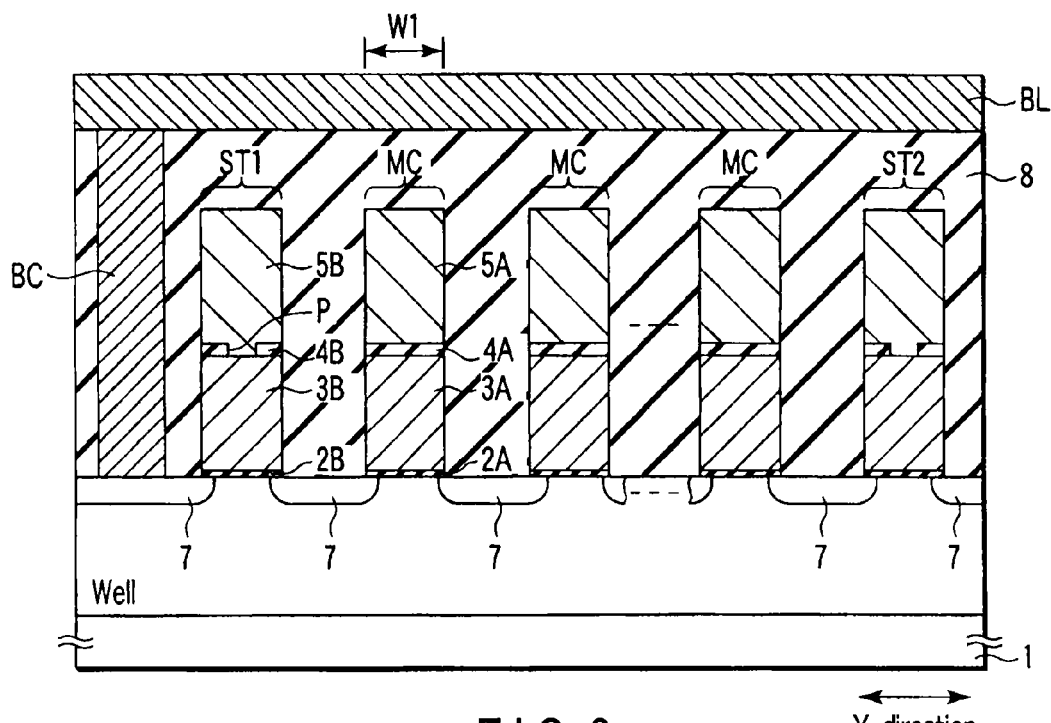
FIG. 3 is a sectional view along the III-III line in FIG. 2.
Figure 4:
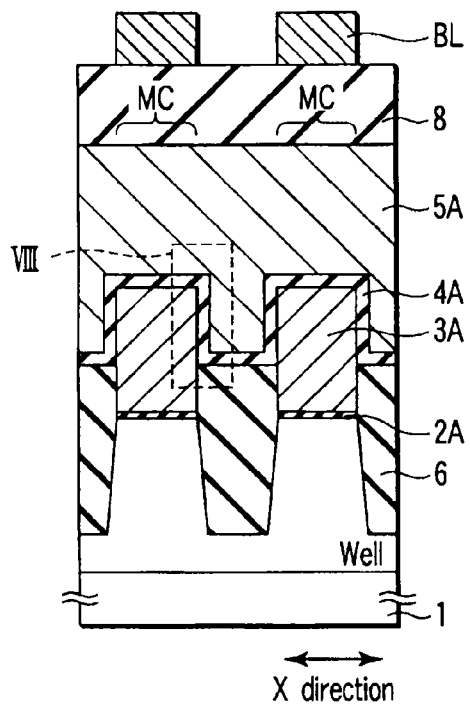
FIG. 4 is a sectional view along the IV-IV line in FIG. 2.

As shown in FIGS. 2 to 4, the memory cell array 100 comprises a first element area AA1 in which the NAND cell units are formed, and a first element separation area STIF by which two element areas AA1 adjacent in a row direction are separated from each other.

In the element area AA1, there are arranged a plurality of memory cells MC, and selective transistors ST1 and ST2 disposed at both ends of the plurality of memory cells MC. One end of the plurality of the memory cell MC is connected to a bit line BL via a bit line contact BC connected to a diffusion layer of the selective transistor ST1. The other end thereof is connected to a common source line (not shown) via the selective transistor ST2.

The memory cell MC is a metal-insulator-semiconductor (MIS) transistor having a stacked gate structure composed of a floating gate electrode 3A and a control gate electrode 5A.

The floating gate electrode 3A is formed on a first gate insulating film 2A on the element area AA1. The floating gate electrodes 3A adjacent in the row direction are separated from each other by a first isolation insulating layer 6 formed in the element separation area.

The control gate electrode 5A is formed on the floating gate electrode 3A via a first intergate insulating film 4A. This control gate electrode 5A extends in an X direction to cover the upper surfaces of the floating gate electrode 3A and the isolation insulating layer 6 via the intergate insulating film 4A.

The control gate electrode 5A covers not only the upper surface of the floating gate electrode 3A but also the side surfaces thereof in the row direction via the intergate insulating film 4A, and thus ensures a high coupling ratio.

Furthermore, a diffusion layer 7 is formed as a source/drain area to connect the adjacent two memory cells in series with each other.

The selective transistors ST1 and ST2 are formed at both ends of a NAND string composed of the plurality of memory cells MC.

The selective transistors ST1 and ST2 are formed at the same time as the memory cells MC, so that the gate electrodes of the selective transistors ST1 and ST2 have stacked structures.

The gate structure is formed on a gate insulating film 2B, and in this structure, a gate electrode 3B formed at the same time as the floating gate electrode 3A is connected to a gate electrode 5B formed at the same time as the control gate electrode 5A via an opening P formed in an intergate insulating film 4B.

Furthermore, the flash memory is not only constituted of the memory cells, but also includes a peripheral transistor forming, for example, the control circuit on the same chip as the memory cell array.

Figure 5:
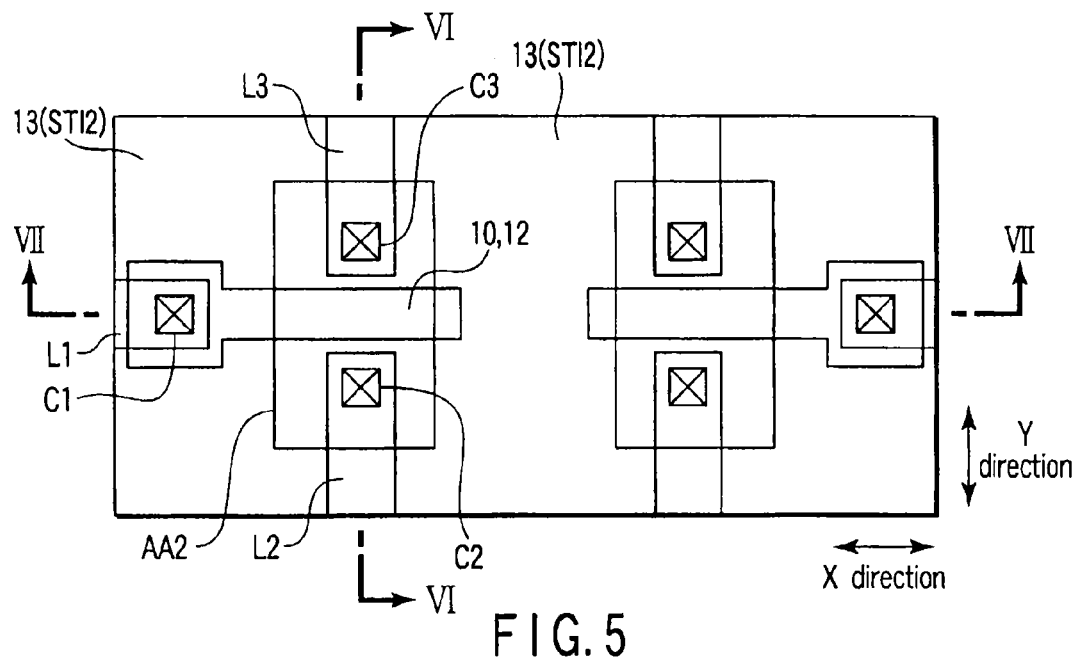
FIG. 5 is a plane view showing the structure of a peripheral transistor region.
Figure 6:
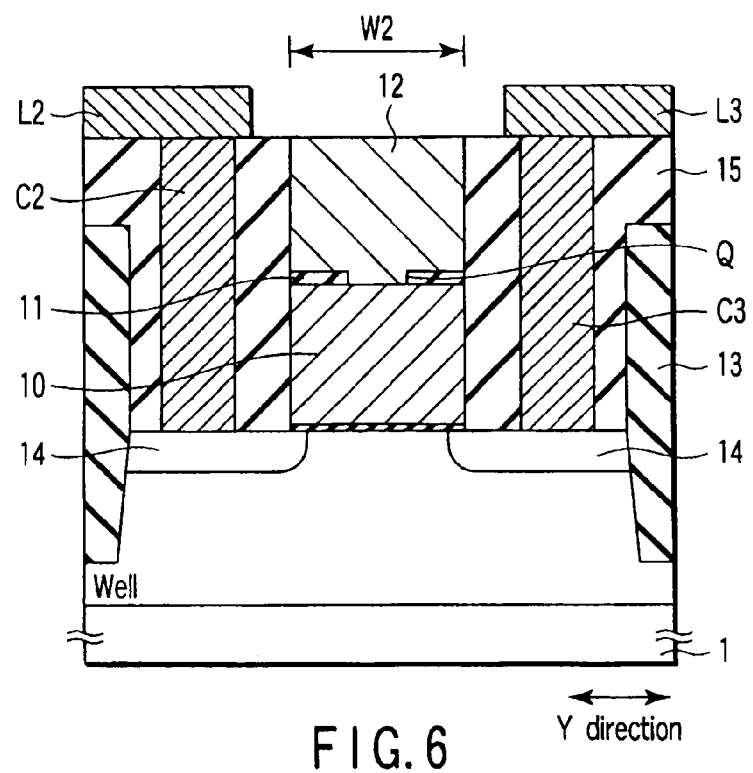
FIG. 6 is a sectional view along the VI-VI line in FIG. 5.
Figure 7:
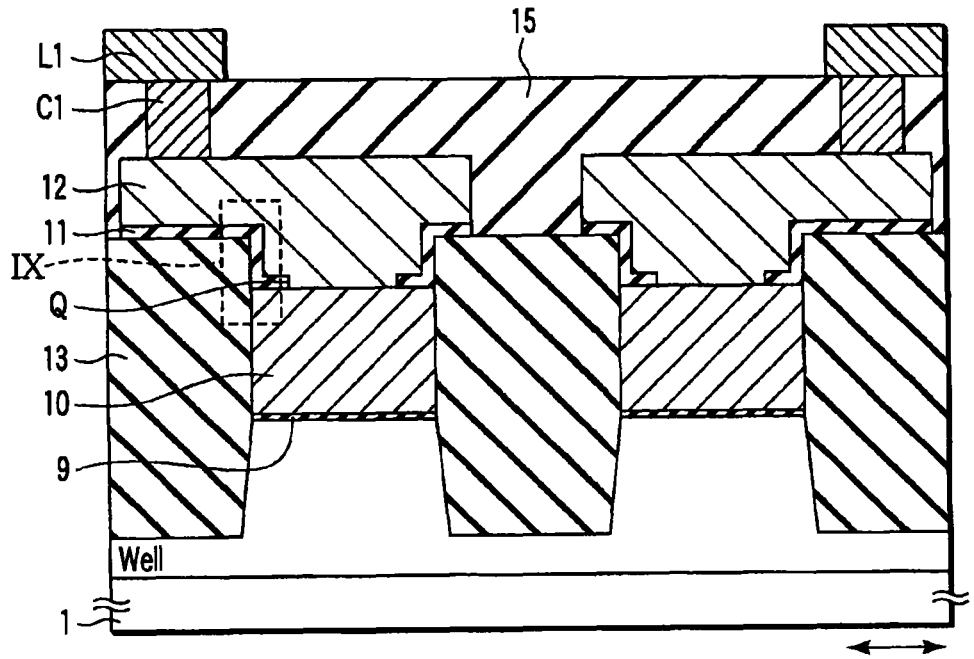
FIG. 7 is a sectional view along the VII-VII line in FIG. 5.

FIG. 5 shows a plane view of the peripheral transistor. Further, FIG. 6 shows a sectional view along the VI-VI line in FIG. 5, and FIG. 7 shows a sectional view along the VII-VII line in FIG. 5.

The peripheral transistor is disposed on a second element area AA2 in a peripheral region.

The peripheral transistor is formed at the same time as the memory cell, so that the gate electrode of the peripheral transistor has a stacked structure composed of a first gate electrode 10 on a second gate insulating film 9 and a second gate electrode 12. Moreover, the stacked gate electrode of the peripheral circuit transistor is formed to have a feature size larger than that of the gate electrode of the memory cell. Thus a width W1 in a Y direction of the gate electrode of the peripheral circuit is larger than a width W2 in the Y direction of the gate electrode of the memory cell.

The stacked gate electrode of the peripheral transistor have a structure in which the first gate electrode 10 formed at the same time as the floating gate electrode 3A of the memory cell is connected to the second gate electrode 12 formed at the same time as the control gate electrode 5A via an opening Q formed in a second intergate insulating film 11.

A diffusion layer 14 is formed as the source or drain of the peripheral transistor in a semiconductor substrate 1.

Furthermore, a metal interconnect layer L1 is connected to the gate electrodes 10 and 12 via a contact portion C1. Moreover, metal interconnect layers L2 and L3 are connected to the diffusion layer 14 serving as the source or drain via contact portions C2 and C3, respectively.

The structure of the intergate insulating film 4A, 11 in the embodiment of the present invention will be described using FIGS. 8 and 9.

Figure 8:
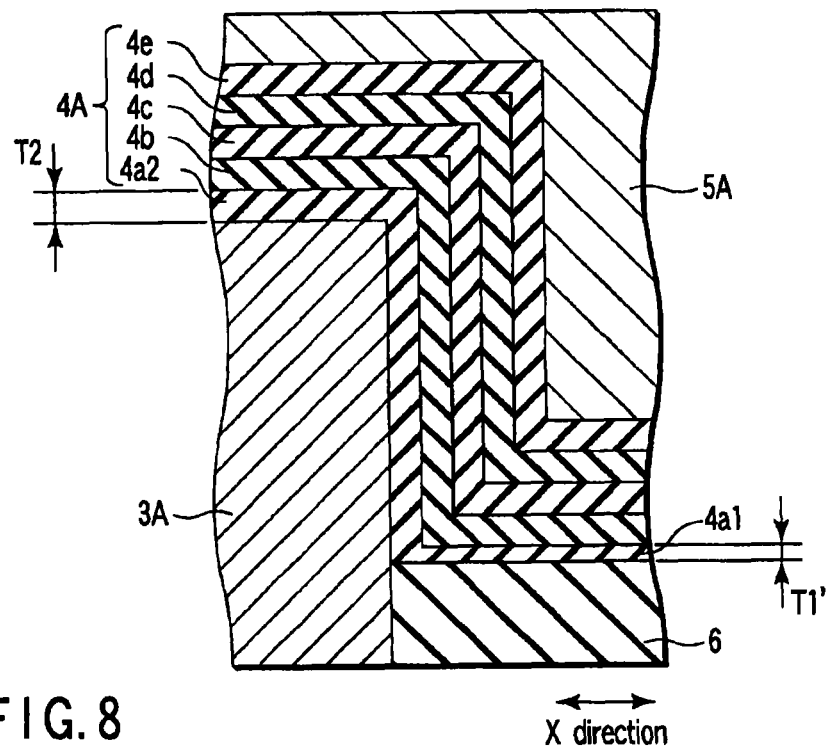
FIG. 8 is an enlarged view of an area VIII shown in FIG. 4.

FIG. 8 shows an enlarged view of an area VIII enclosed by a broken line in FIG. 4.

In the present embodiment, the intergate insulating film 4A of the memory cell is, for example, a continuous film or a so-called NONON film having a five-layer structure composed of a silicon nitride film $4a1$, $4a2$, a silicon oxide film $4b$, a silicon nitride film $4c$, a silicon oxide film $4d$ and a silicon nitride film $4e$, as shown in FIG. 8.

The thickness of the silicon nitride film $4a1$, $4a2$ in the lowermost layer of the intergate insulating film 4A having the five-layer structure varies depending on whether this silicon nitride film is on the floating gate electrode 3A made of polysilicon or on the isolation insulating layer 6 made of silicon oxide.

This is attributed to the fact that the nitriding rate on the floating gate electrode 3A made of polysilicon is different from that on the isolation insulating layer 6 made of silicon oxide because the silicon nitride film $4a1$, $4a2$ serving as the lowermost layer of the intergate insulating film 4A is formed by radical nitriding.

Therefore, a thickness T1' of the silicon nitride film $4a1$ formed on the isolation insulating layer 6 is smaller than a thickness T2 of the silicon nitride film $4a2$ formed on the floating gate electrode 3A.

In addition, the intergate insulating film 4A is a continuous film having a multilayer structure, and the thickness of a lowermost film formed on the isolation insulating layer of the multilayer film has only to be smaller than the thickness of a lowermost film formed on the floating gate electrode. Thus, the intergate insulating film 4A is not limited to the NONON film, and may be, for example, a multilayer film using high dielectric films made of HfAlO, AlO, HfSiO, ZrSiO, etc. As one example of such, high dielectric films may be used instead of the silicon oxide films described above, and a multilayer structure may be formed by the silicon nitride films and these high dielectric films.

When the structure of the intergate insulating film as described above is used, the parasitic capacitance between the floating gate electrodes 3A adjacent in the row direction is reduced owing to the small thickness of the silicon nitride film serving as the lowermost layer of the intergate insulating film 4A formed on the isolation insulating layer.

Therefore, the variation of a threshold voltage of the memory cell due to inter-cell interference can be suppressed, and write characteristics of the memory cell can be improved.

Figure 9:
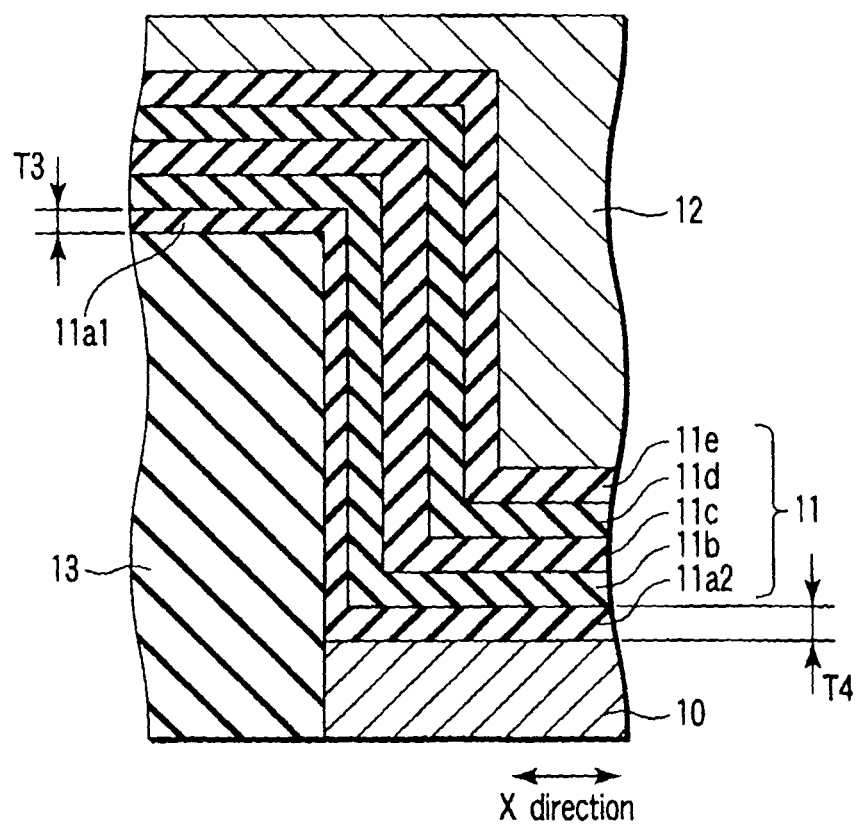
FIG. 9 is an enlarged view of an area IX shown in FIG. 7.

Furthermore, FIG. 9 is an enlarged view showing one example of the structure of the intergate insulating film 11 in an area IX enclosed by a broken line in the peripheral transistor in FIG. 7.

The intergate insulating film 11 of the peripheral transistor is formed at the same time as the intergate insulating film of the memory cell, and is therefore, for example, a contiguous multilayer film such as a NONON film.

This intergate insulating film 11 is formed on the first gate electrode 10 and a second isolation insulating layer 13 in a second element isolation area STI2 of the semiconductor substrate 1.

In the insulating film serving as the lowermost layer of the multilayer structure intergate insulating film 11 of the peripheral transistor, a thickness T3 of a silicon nitride film 11a1 on the isolation insulating layer 13 is equal to or smaller than a thickness T4 of a silicon nitride film 11a2 formed on the gate electrode 10 of the peripheral transistor.

The present embodiment is characterized in that the thickness T1 of the silicon nitride film 4a1 formed on the isolation insulating layer 6 of the memory cell shown in FIG. 8 is smaller than the thickness T3 of the silicon nitride film 11a1 formed on the isolation insulating layer 13 of the intergate insulating film 11 of the peripheral transistor.

That is, the thickness T3 is larger than the thickness T1', and equal to or smaller than the thickness T4. In addition, the thickness T2 is, for example, equal to the thickness T4.

Figure 10:
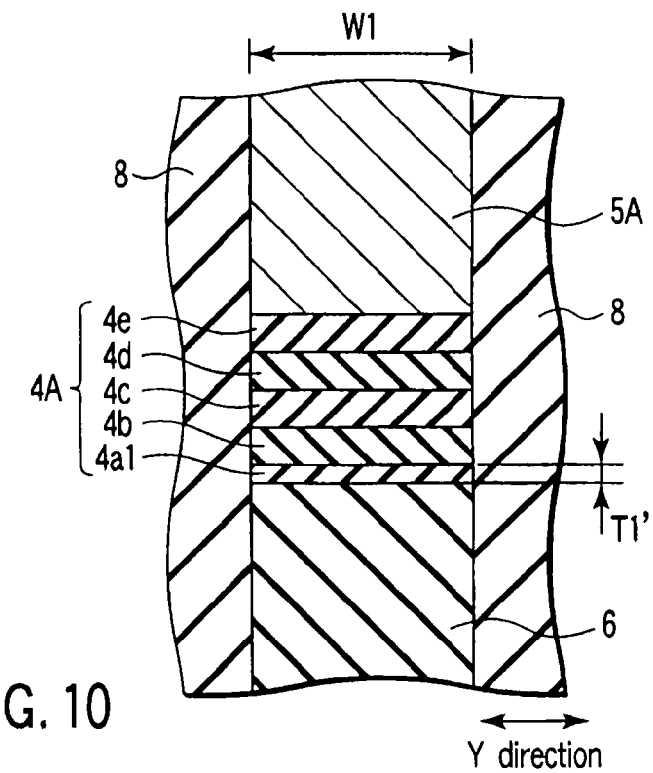
FIG. 10 is a sectional view showing the structure of an intergate insulating film of a memory cell.
Figure 11:
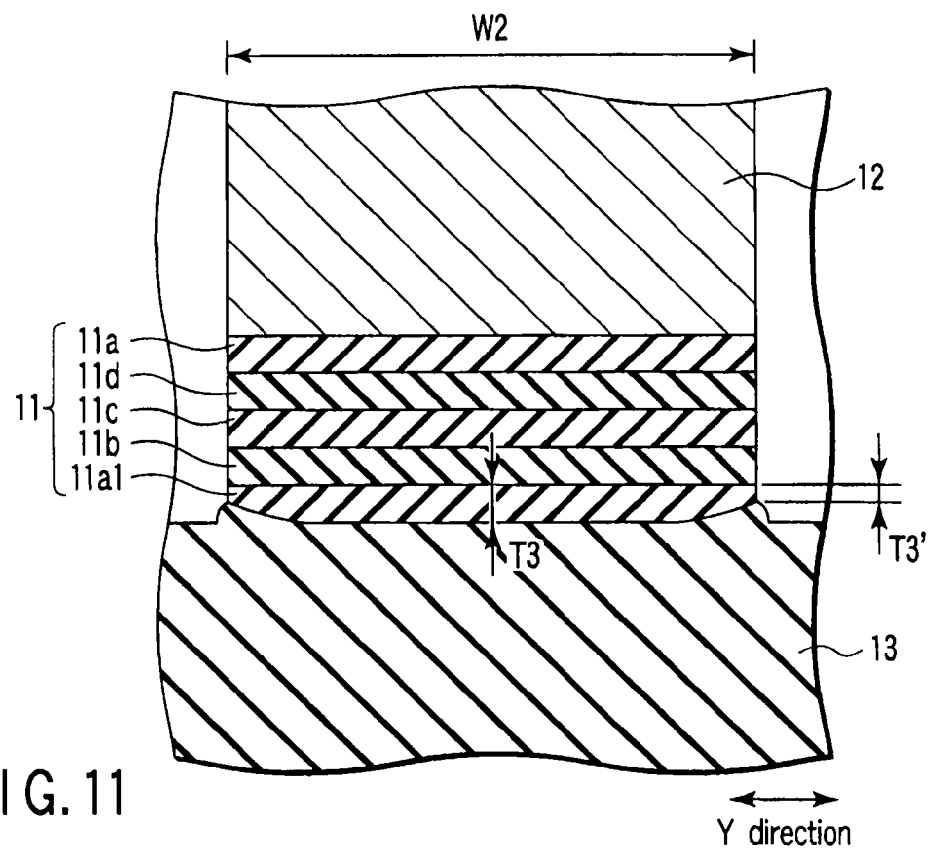
FIG. 11 is a sectional view showing the structure of an intergate insulating film of the peripheral transistor.

Furthermore, FIGS. 10 and 11 are Y-direction sectional views of the intergate insulating films 4 and 11 on the isolation insulating layers 6 and 13 in the memory cell and the peripheral transistor.

As shown in FIG. 10, in the intergate insulating film 4 of the memory cell, the lowermost film (silicon nitride film) 4a1 of the intergate insulating film on the isolation insulating layer 6 has, for example, a uniform thickness and is equal to the thickness T1' in every part.

Furthermore, as shown in FIG. 11, in the lowermost film on the isolation insulating layer 13 of the intergate insulating film of the peripheral transistor, a thickness T3' of the intergate insulating film at the end of the gate electrode is smaller than the thickness T3 of the intergate insulating film in the center of the gate electrode.

The reason for this is that when a sidewall oxidizing process is carried out after gate processing, an oxidizer diffuses in the isolation insulating layer up to the center of the gate electrode so that the entire surface of the silicon nitride film 4a1 is uniformly oxidized in the memory cell processed in a micro feature size.

On the other hand, in the peripheral transistor processed in a larger feature size than the memory cell, the oxidizer does not diffuse up to the center of the gate electrode. Thus, the intergate insulating film 11a1 is oxidized and its thickness is reduced at the end of the gate electrode alone, and the silicon nitride film 11a1 is not oxidized and its thickness does not change in the center of the gate electrode.

Therefore, in the multilayer structure intergate insulating film of the peripheral transistor, the thickness T3' of the intergate insulating film 11 at the end of the gate electrode is smaller than the thickness T3 of the intergate insulating film 11 in the center of the gate electrode. In addition, the thickness T3' at the end of the lowermost film 11a1 of the intergate insulating film 11 is, for example, equal to the thickness T1 of the lowermost film 4a1.

With regard to the memory cell, the structure described above makes it possible to reduce the parasitic capacitance between the adjacent floating gate electrodes of the memory cell and reduce the amount of variation of the threshold voltage of the memory cell due to the inter-cell interference.

Furthermore, with regard to the peripheral transistor, the intergate insulating film 11a1 is formed on the isolation insulating layer 13, such that it is possible to suppress the diffusion of elements forming a fixed charge into the semiconductor substrate 1 located lower than the intergate insulating film 11, especially in the vicinity of an interface between the isolation insulating layer 13 and the semiconductor substrate 1.

For example, when the high dielectric films made of HfAlO, AlO, HfSiO, ZrSiO, etc. are used for the multilayer structure intergate insulating films, Hf, Al, Zr, etc. easily diffuse as fixed charges into the semiconductor substrate 1.

Therefore, the present embodiment is more effective when the high dielectric films are used for the intergate insulating films.

Thus, the intergate insulating film 11a1 is formed to be thicker than the intergate insulating film 4a1, such that the formation of the fixed charge can prevent the degradation of the performance of the peripheral transistor.

In addition, the effects described above can be obtained even when, for example, natural oxide films such as silicon oxide films are formed between the floating gate electrode 3A and the lowermost film 4a1 and between the gate electrode 10 and the lowermost film 11a1.

(b) Manufacturing Method

A method of manufacturing the memory cell and the peripheral transistor shown in the present embodiment will be described below.

First, as shown in FIGS. 12 and 13, a well region Well is formed by, for example, an ion implantation method in the semiconductor substrate 1 in a memory cell area where the memory cell is provided and in a peripheral transistor area where the peripheral transistor is provided. Then, the first and the second gate insulating films 2 and 9 are formed on the surface of the semiconductor substrate 1 by, for example, a thermal oxidation method.

Next, polysilicon films 3 and 10 serving as the floating gate electrode of the memory cell and the first gate electrode of the peripheral transistor are formed on the gate insulating film 2 by, for example, a chemical vapor deposition (CVD) method.

Subsequently, silicon nitride films 16 serving as mask materials are formed on the polysilicon films 3 and 10 by, for example, the CVD method. Further, the silicon nitride films 16 are patterned so that the polysilicon films 3 and 10 have a desired channel width, respectively, and then etching is carried out by, for example, a reactive ion etching (RIE) method to reach the inside of the semiconductor substrate 1. Thus, isolation trench are formed in the semiconductor substrate 1 in the memory cell area and the peripheral transistor area. In addition, at this point, the feature size of the peripheral transistor in the channel width direction is formed to be greater than the feature size of the memory cell in the channel width direction.

Next, for example, a silicon oxide serving as the isolation insulating layers in the memory cell area and the peripheral transistor area is formed on the entire surface of the semiconductor substrate 1 by, for example, the CVD method so that the isolation trench are completely embedded with the silicon oxide. Then, the isolation insulating layers are planarized by chemical mechanical polishing (CMP) using the silicon nitride films 16 as stopper films.

Figure 14:
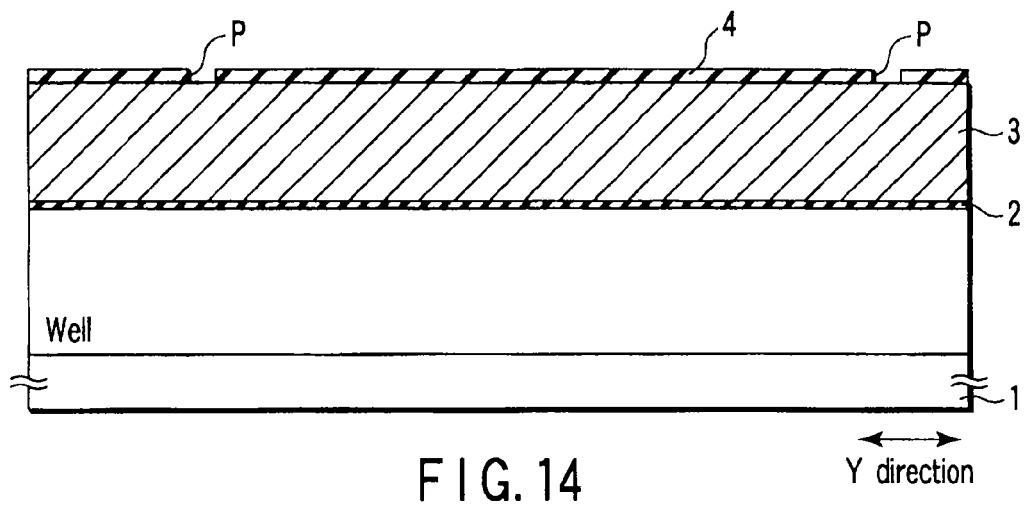
FIG. 14 is a sectional view showing a manufacturing process in the first embodiment.
Figure 15:
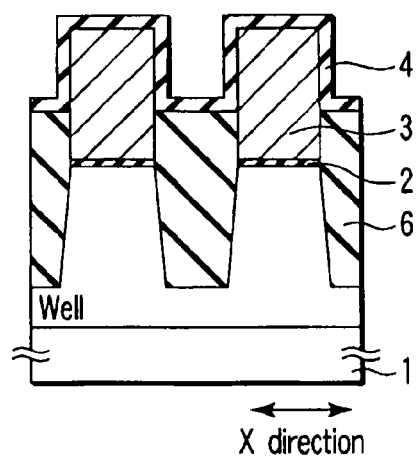
FIG. 15 is a sectional view showing a manufacturing process in the first embodiment.

Furthermore, the SiN film as the mask material is removed, and then the first isolation insulating layer 6 is etched back so that the upper surface of the isolation insulating layer 6 is positioned lower than the upper surface of the polysilicon film 3 serving as the floating gate electrode in the memory cell area, as shown in FIGS. 14 and 15.

Then, the intergate insulating film 4 is formed on the polysilicon film 3 and the isolation insulating layer 6.

In the peripheral transistor area, the intergate insulating film 11 is formed on the polysilicon film 10 and the second isolation insulating layer 13 at the same time as the memory cell area, as shown in FIGS. 16 and 17.

Figure 18:
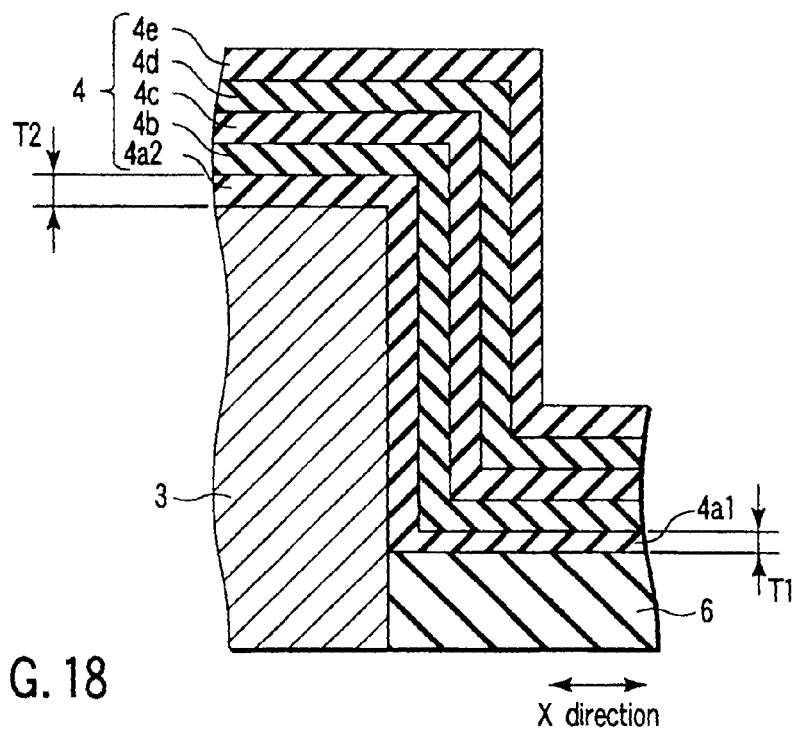
FIG. 18 is a sectional view showing a manufacturing process in the first embodiment.
Figure 19:
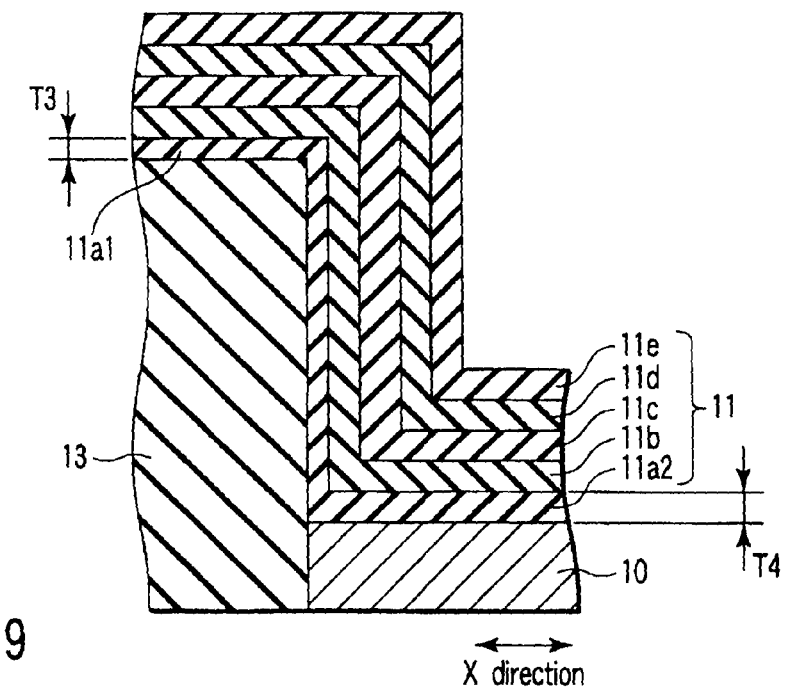
FIG. 19 is a sectional view showing a manufacturing process in the first embodiment.

Here, as shown in FIG. 18, the intergate insulating film 4 of the memory cell is a continuous film having a five-layer structure composed of the silicon nitride film 4a1, 4a2, the silicon oxide film 4b, the silicon nitride film 4c, the silicon oxide film 4d and the silicon nitride film 4e. Moreover, as shown in FIG. 19, the intergate insulating film 11 of the peripheral transistor is also a continuous film having a five-layer structure composed of the silicon nitride film 11a1, 11a2, a silicon oxide film 11b, a silicon nitride film 11c, a silicon oxide film 11d and a silicon nitride film 11e.

The silicon nitride films 4a1, 4a2, 11a1 and 11a2 serving as the lowermost layers of the five-layer structure intergate insulating films 4 and 11 are formed by nitriding the surface of the polysilicon films 3, 10 and the surface of the isolation insulating layers 6, 13 through radical nitriding which is carried out under, for example, the following conditions: Ar=1000 sccm, N2=40 sccm, RF power=500 W or less, and pressure=$1.33 \times 10^2$ Pa or more.

The thickness of the silicon nitride films 4a1, 4a2, 11a1 and 11a2 formed by radical nitriding varies depending on the parts where they are formed because the nitriding rate is different depending on the part where nitride films are formed, unlike those formed by the CVD method at a uniform thickness.

That is, polysilicon forming the floating gate electrode 3 and the first gate electrode 10 has a large number of dangling bonds on its surface, and therefore relatively easily reacts with a nitrogen radical. On the other hand, the silicon oxide forming the isolation insulating layer 6, 13 has a small number of dangling bonds on its surface, and does not easily react with the nitrogen radical because the bond energy between silicon atoms and oxygen atoms forming silicon oxide is strong.

As a result, the thickness T1, T3 of the silicon nitride film 4a1, 11a1 formed on the isolation insulating layer 6, 13 is formed to be smaller than the thickness T2, T4 of the silicon nitride film 4a2, 11a2 formed on the polysilicon film 3. In addition, the silicon nitride films 4a1 and 11a1 on the isolation insulating layers 4 and 13 are formed at the same time in the memory cell and the peripheral transistor, and thus have the same thickness.

After the silicon nitride films 4a1, 4a2, 11a1 and 11a2 serving as the lowermost layers of the intergate insulating films are formed by radical nitriding, the silicon oxide films 4b and 11b, the silicon nitride films 4c and 11c, the silicon oxide films 4d and 11d, and the silicon nitride films 4e and 11e are sequentially formed by, for example, the CVD method. These films are formed by the CVD method at, for example, a uniform thickness on the silicon nitride films 4a1, 4a2, 11a1 and 11a2.

In addition, the silicon nitride films serving as the lowermost layers of the intergate insulating films 4 and 11 may be formed by the CVD method. In this case, the thickness of the silicon nitride films serving as the lowermost layers is the same on the polysilicon films 3 and 10 and the isolation insulating layers 6 and 11.

Furthermore, after the intergate insulating films 4 and 11 are formed, the openings P and Q are formed by, for example, the RIE method in the intergate insulating films 4 and 11 where the selective transistors and the peripheral transistor are scheduled to be formed.

Next, the polysilicon films serving as control electrodes of the memory cell are formed by, for example, the CVD method on the intergate insulating films 4 and 11. Further, the polysilicon films are patterned so that the memory cell, the selective transistors and the peripheral transistor have desired channel lengths, and gate processing is carried out by, for example, the RIE method.

Then, as shown in FIGS. 20 and 21, in the memory cell area, there are formed a stacked gate electrode of the memory cell composed of the floating gate electrode 3A, the intergate insulating film 4A and the control gate electrode 5A, and a stacked gate electrode of the selective transistor ST1, ST2 in which the gate electrodes 3B and 5B are stacked via the partially opened intergate insulating film 4B. Moreover, the X-direction sidewalls of the floating gate electrode 3A are covered with the control gate electrode 5A via the intergate insulating film 4A.

Figure 22:
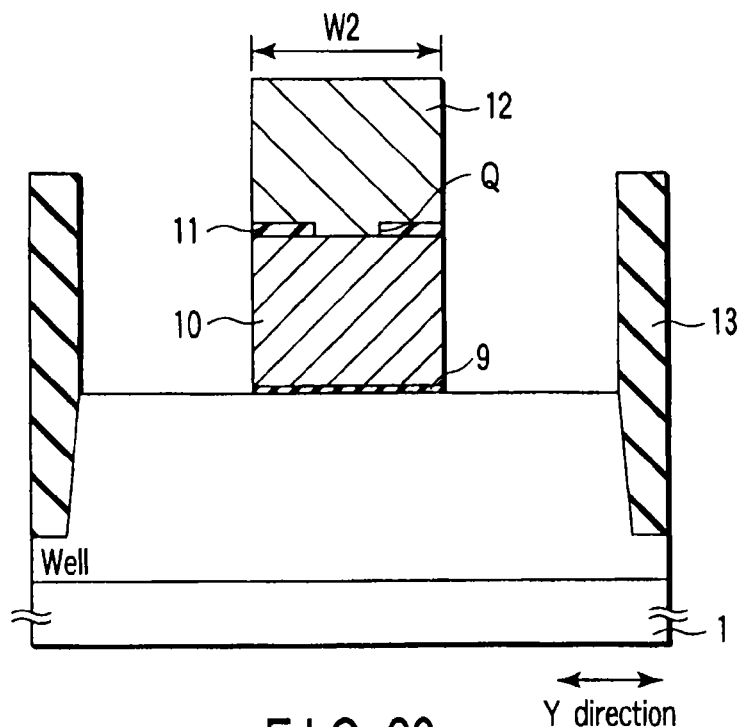
FIG. 22 is a sectional view showing a manufacturing process in the first embodiment.
Figure 23:
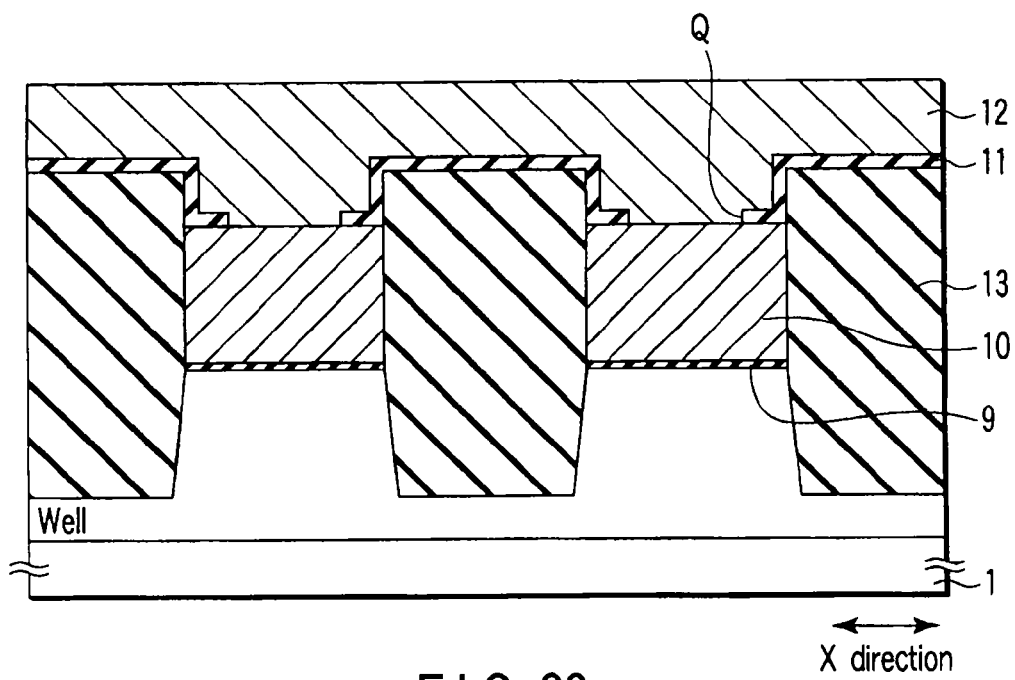
FIG. 23 is a sectional view showing a manufacturing process in the first embodiment.

Furthermore, as shown in FIGS. 22 and 23, in the peripheral transistor area, a stacked gate electrode of the peripheral transistor in which the gate electrodes 10 and 12 are connected to each other via the partially opened intergate insulating film 11 is formed in a process simultaneous with the formation of the memory cell area.

At this point, a size W2 in a channel length direction (Y direction) of the peripheral transistor is gate-processed to be larger than a size W1 in the channel length direction of the memory cell.

Moreover, after the gate processing, thermal oxidation is carried out in an oxidation atmosphere at, for example, 1085° C., so that sidewall oxide films (not shown) having a thickness of, for example, 10 nm are formed on the sidewalls of the gate electrodes of the memory cell and the peripheral transistor.

At this point, an oxidizer supplied from the end of the gate diffuses into the entire the isolation insulating layer 6 in the memory cell in which the feature size of the gate electrode is small.

Figure 24:
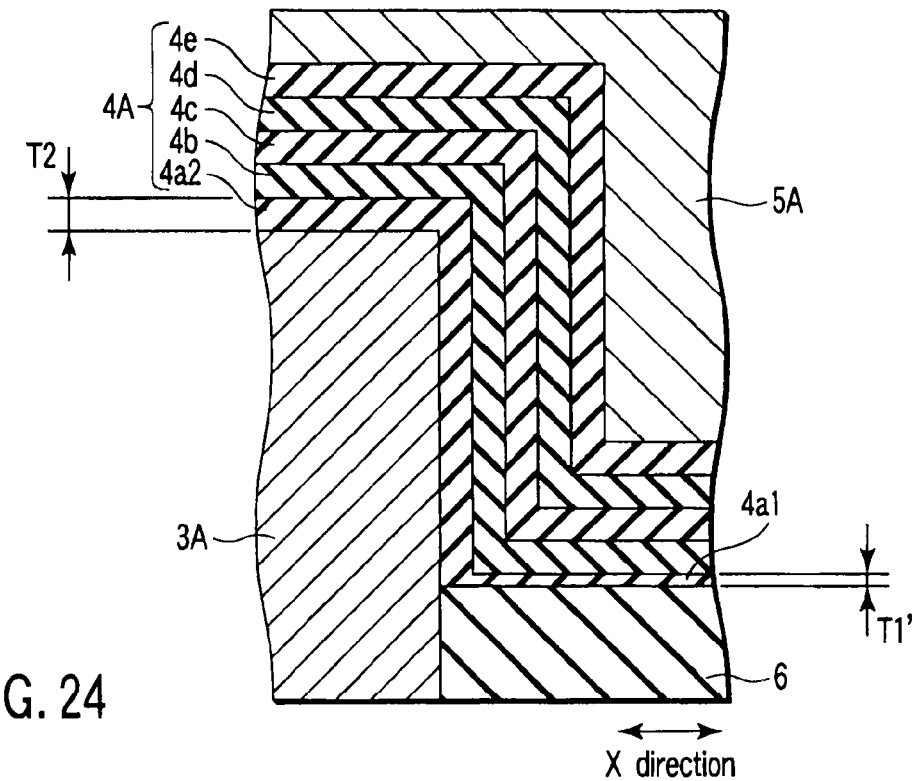
FIG. 24 is a sectional view showing a manufacturing process in the first embodiment.

Therefore, as shown in FIG. 24, the entire silicon nitride film 4a1 on the isolation insulating layer 6 of the memory cell is oxidized by the oxidizer which diffuses within the isolation insulating layer 6, so that the thickness of the silicon nitride film 4a1 decreases to a thickness T1' from a thickness T1. That is, the sidewall oxidizing process is carried out after the gate processing, such that the thickness T1' of the silicon nitride film 4a1 formed on the isolation insulating layer 6 of the memory cell is smaller than the thickness T1 of the silicon nitride film formed by radical nitriding.

Figure 25:
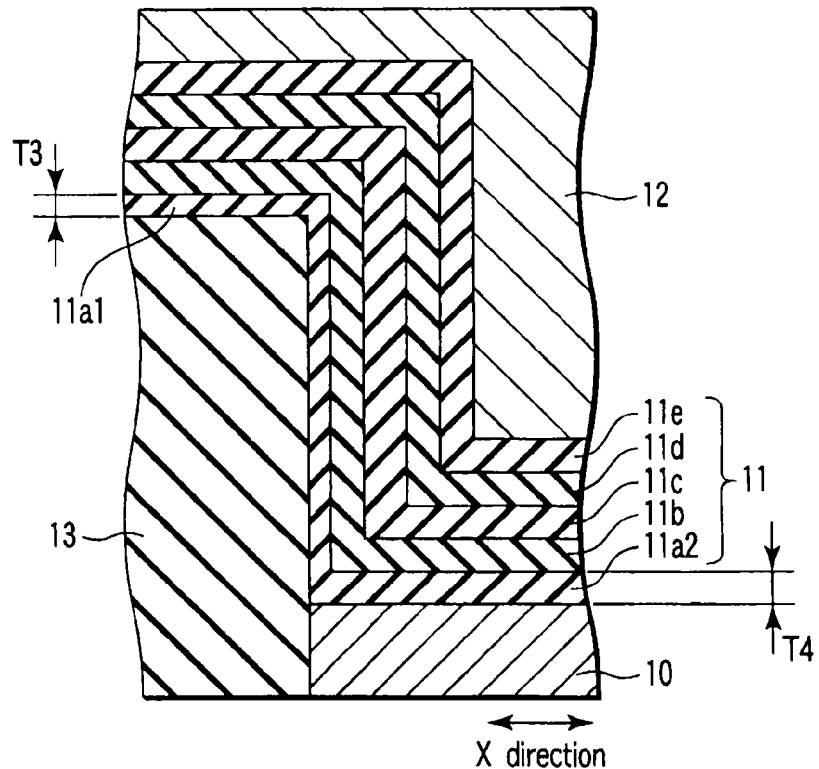
FIG. 25 is a sectional view showing a manufacturing process in the first embodiment.

On the contrary, in the peripheral transistor in which the processing dimension of the gate electrode is larger than that in the memory cell, the oxidizer supplied from the end of the gate electrode does not diffuse throughout the entire isolation insulating layer 13 because the peripheral transistor is formed in a large processing dimension, as shown in FIG. 25. Thus, the silicon nitride film 11a1 on the isolation insulating layer 13 of the peripheral transistor is oxidized at its end, but is not entirely oxidized, so that the thickness at the time of its formation is maintained, and the thickness T3 of the silicon nitride film 11a1 does not decrease.

Therefore, the thickness T1' of the silicon nitride film 4a1 is smaller than the thickness T3 of the silicon nitride film 11a1.

Figure 26:
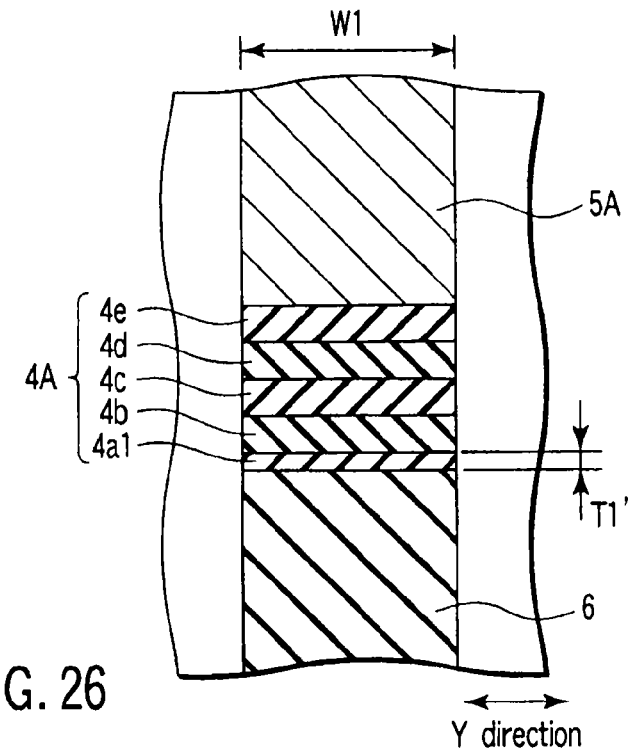
FIG. 26 is a sectional view showing a manufacturing process in the first embodiment.
Figure 27:
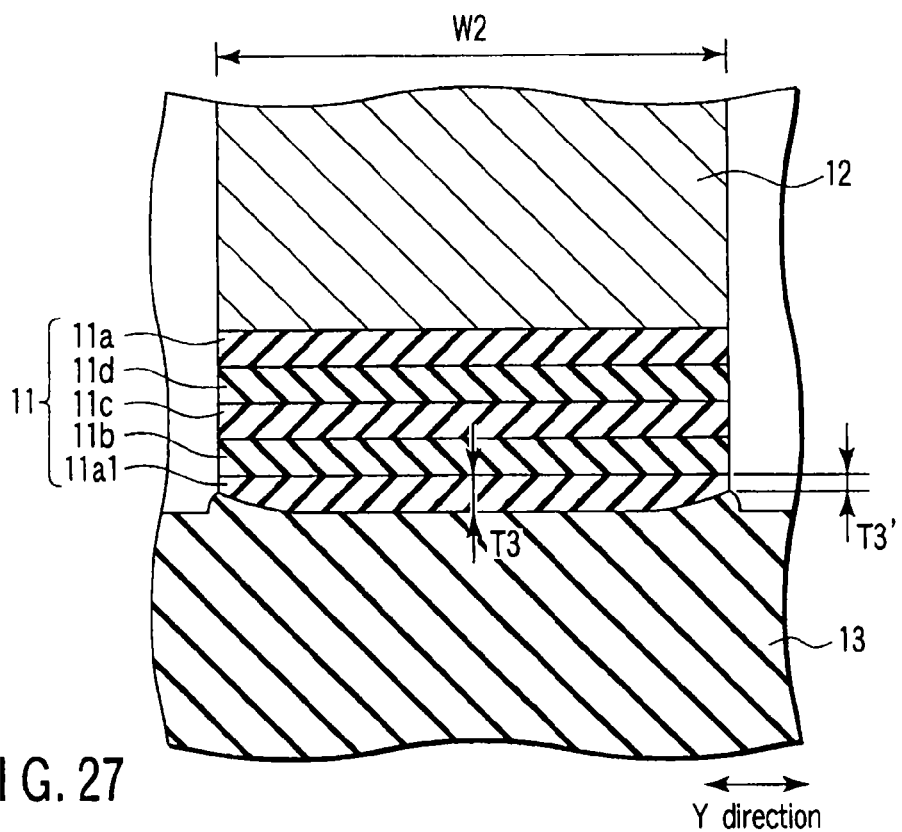
FIG. 27 is a sectional view showing a manufacturing process in the first embodiment.

Furthermore, FIGS. 26 and 27 show the Y-direction sectional structure of the intergate insulating films 4 and 11 on the isolation insulating layers 6 and 13.

In the memory cell, the entire silicon nitride film 4a1 serving as the lowermost layer of the intergate insulating film 4 is oxidized as shown in FIG. 26, so that its thickness T1' at the end and center is equal.

On the other hand, in the peripheral transistor, the insulating film 11a1 serving as the lowermost layer of the intergate insulating film 11 is oxidized and becomes thinner at its end due to the sidewall oxidizing process as described above, but is not oxidized in its center. Thus, the thickness T3' at the end of the silicon nitride film 11a1 is smaller than the thickness T3 in the center of the insulating film 11a1.

Figure 28:
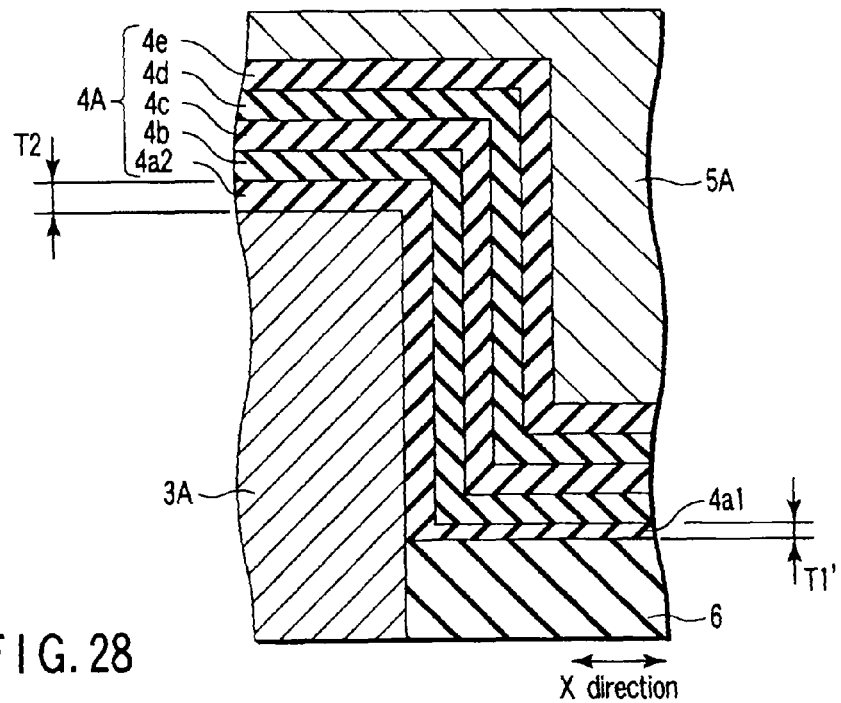
FIG. 28 is a sectional view showing a manufacturing process in the first embodiment.
Figure 29:
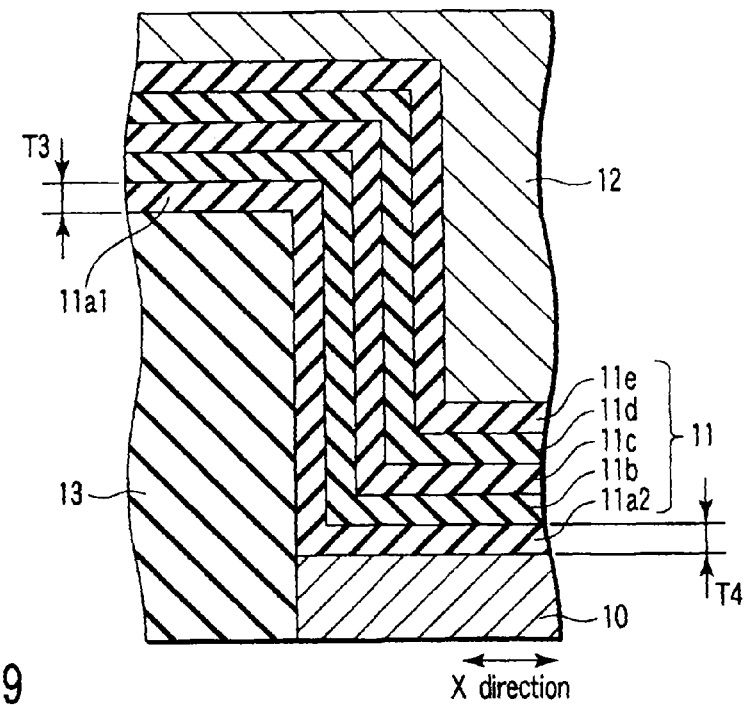
FIG. 29 is a sectional view showing a manufacturing process in the first embodiment.

In addition, FIGS. 28 and 29 show cases where the silicon nitride films 4a1, 4a2, 11a1 and 11a2 are formed by the CVD method.

In this case, in the memory cell, the silicon nitride film serving as the lowermost layer of the intergate insulating film has, at the time of its formation, the same thickness on the isolation insulating layer 6 and on the floating gate electrode 3, as shown in FIG. 28. However, since the entire silicon nitride film on the isolation insulating layer 6 is oxidized by the sidewall oxidizing process, the thickness T1' of the silicon nitride film 4a1 formed on the isolation insulating layer 6 of the memory cell is smaller than the thickness T2 of the silicon nitride film 4a2 on the floating gate electrode 3.

Furthermore, as shown in FIG. 29, in the peripheral transistor, the thickness T3 of the silicon nitride film 11a1 formed on the isolation insulating layer 13 is equal to the thickness T4 of the silicon nitride film 11a2 formed on the gate electrode 10 even after the sidewall oxidizing process.

In addition, the Y-direction sectional structures of the intergate insulating films 4 and 11 on the isolation insulating layers 6 and 13 are also similar to those in FIGS. 26 and 27 when the silicon nitride films 4a1, 4a2, 11a1 and 11a2 are formed by the CVD method.

Subsequently, as shown in FIGS. 2 to 7, the diffusion layers 7 and 14 are formed in the semiconductor substrate 1 in a self-aligning manner using the gate electrodes as masks, in the memory cell area and the peripheral transistor area. Then, insulating films 8 and 15 are formed on the entire surface of the semiconductor substrate 1 by, for example, the CVD method.

Furthermore, in the memory cell area, a bit line contact portion BC is embedded to reach the drain of the selective transistor ST1 via a contact hole formed in the insulating film 8. Then, the bit line BL is connected to the bit line contact portion BC.

Moreover, in the peripheral transistor area, the contact plugs C1, C2 and C3 are embedded to reach the electrode of the peripheral transistor and the source and drain diffusion layer 14 via a contact hole formed in the insulating film 15. Then, the metal interconnect layer L1, L2 and L3 is connected to a contact plug C1, C2 and C3.

The memory cell and the peripheral transistor in the present embodiment are formed in the manufacturing process described above.

As described above, the silicon nitride films 4a1, 4a2, 11a1 and 11a2 serving as the lowermost layers of the intergate insulating films are formed by radical nitriding or the CVD method. Further, the sidewall oxidizing process is carried out after the gate processing.

Therefore, as shown in FIGS. 24 and 28, the thickness T1 of the silicon nitride film 4a1 on the isolation insulating layer 6 can be formed to be smaller than the thickness T2 of the silicon nitride film 4a2 on the floating gate electrode 3A in memory cell.

Thus, the parasitic capacitance between the floating gate electrodes adjacent in the X direction is reduced owing to the small thickness of the silicon nitride film 4a1 formed on the isolation insulating layer 6.

It is therefore possible to manufacture a memory cell which can suppress a further variation of the threshold voltage of the memory cell due to the inter-cell interference.

On the other hand, as shown in FIGS. 25 and 29, the silicon nitride film 11a1 on the isolation insulating layer 13 can suppress the diffusion of the fixed charge into the semiconductor substrate in the peripheral transistor.

It is therefore possible to manufacture a peripheral transistor which can prevent the deterioration of the operating characteristics of the transistor due to the fixed charge.

(2) Second Embodiment

Structures in a second embodiment will be described below using FIGS. 30 to 35.

It is to be noted that all the structures of a memory cell and a peripheral transistor are similar to those in the first embodiment, and that the same signs are assigned to the same members and these members are not described in detail.

FIGS. 30 to 35 are diagrams showing the structures of intergate insulating films 4A and 11 of the memory cell and the peripheral transistor in the present embodiment.

In the present embodiment, a silicon nitride film serving as a lowermost layer of the intergate insulating film 4A of the memory cell is a silicon nitride film 4a2 formed on a floating gate electrode 3A alone, and no silicon nitride film serving as a lowermost layer is formed on an isolation insulating layer 6.

More specifically, the silicon nitride film 4a2 is formed on the upper surface of the floating gate electrode 3A and on part of the sidewall of the floating gate electrode 3A which is not in contact with the isolation insulating layer 6. At this point, a silicon oxide film 4b formed by, for example, a CVD method is in contact with the top of the isolation insulating layer 6.

Figure 31:
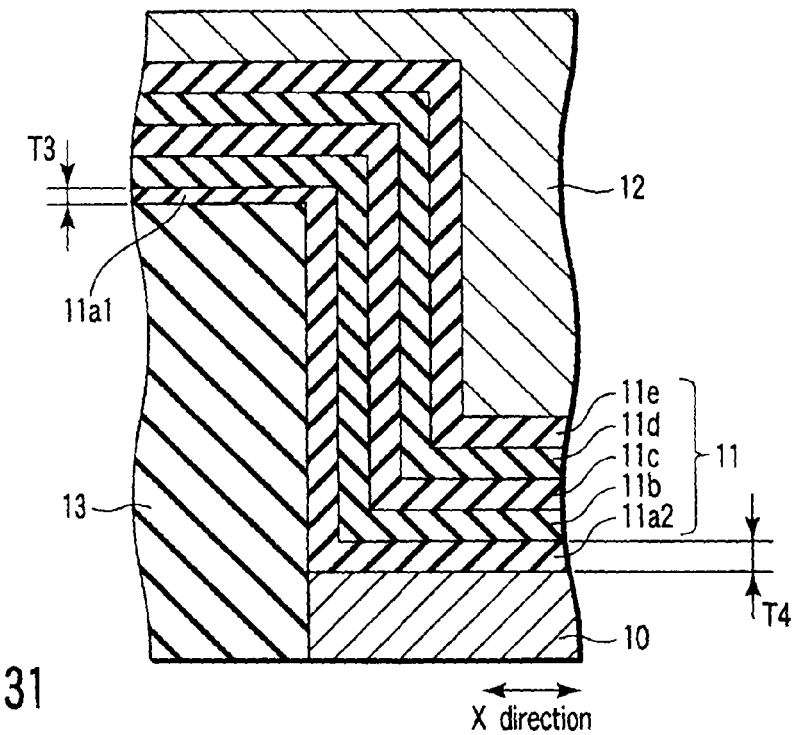
FIG. 31 is a sectional view showing the structure of the intergate insulating film of the peripheral transistor.

On the other hand, as shown in FIG. 31, a silicon nitride film 11a1 serving as a lowermost layer of the intergate insulating film 11 of the peripheral transistor is formed on an isolation insulating layer 13 of the peripheral transistor.

Such a structure can be obtained by changing the conditions of the sidewall oxidizing process of the gate electrode after gate processing shown in the first embodiment, for example, by increasing the concentration of an oxidizer so that the diffusion of the oxidizer into the isolation insulating layer 6 is promoted.

A case will be described below where a silicon nitride film serving as the lowermost layer of the intergate insulating film is formed by radical nitriding. In addition, in the case of formation by radical nitriding, conditions are set to be similar to the conditions in the first embodiment, or set so that a radical reaction is suppressed by, for example, reducing one of RF power, gas pressure and the concentration of a nitrogen gas.

When a silicon nitride film serving as the lowermost layer of the intergate insulating film is formed under the radical nitriding conditions shown in the first embodiment, the silicon nitride film has the same thickness on the isolation insulating layers 6 and 13 of the memory cell and the peripheral transistor. Or, under the conditions where the radical nitriding is suppressed, the thickness of the silicon nitride film is smaller than the thickness of the silicon nitride film formed under the radical nitriding conditions in the first embodiment.

Then, as in the first embodiment, a gate electrode sidewall oxidizing process is carried out. At this moment, oxidation is carried out until the silicon nitride film on the isolation insulating layer 6 of the memory cell is sufficiently oxidized by the oxidizer diffusing in the isolation insulating layer 6 and disappears. In the peripheral transistor, the oxidizer only diffuses in the end of the isolation insulating layer 13 owing to the large feature size of this isolation insulating layer 13, so that the silicon nitride film 11a1 on the isolation insulating layer 13 maintains the thickness at which it has been formed by radical nitriding.

Figure 30:
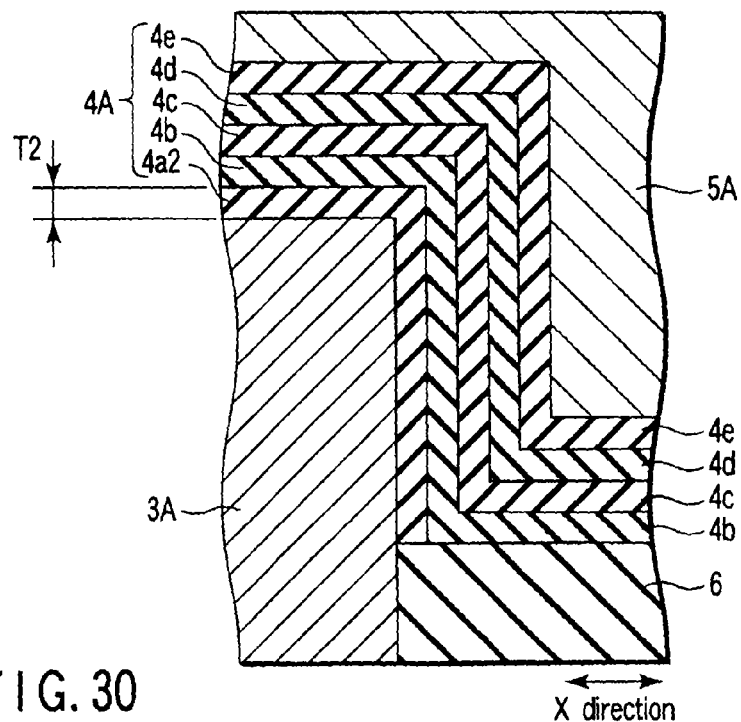
FIG. 30 is a sectional view showing the structure of the intergate insulating film of the memory cell.

Therefore, as shown in FIG. 30, no silicon nitride film serving as the lowermost layer of the intergate insulating film 4A is present on the isolation insulating layer 6 in the memory cell. In the peripheral transistor, the silicon nitride film 11a1 on the isolation insulating layer 13 is formed at a thickness T3, as shown in FIG. 31.

At this point, the thickness T3 of the silicon nitride film 11a1 formed on the isolation insulating layer 13 of the peripheral transistor is smaller than a thickness T4 of a silicon nitride film 11a2 formed on a first gate electrode 10.

Figure 32:
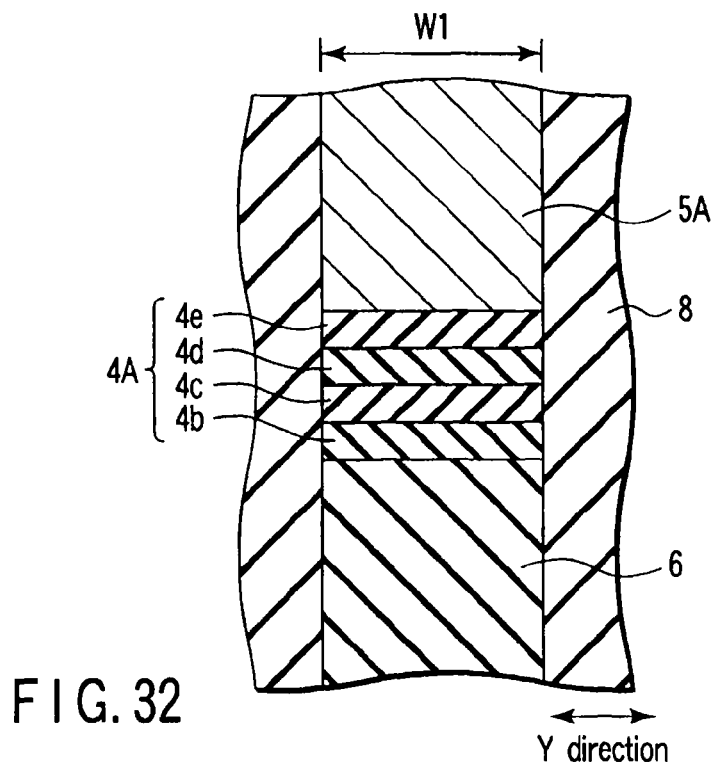
FIG. 32 is a sectional view showing the structure of the intergate insulating film of the memory cell.
Figure 33:
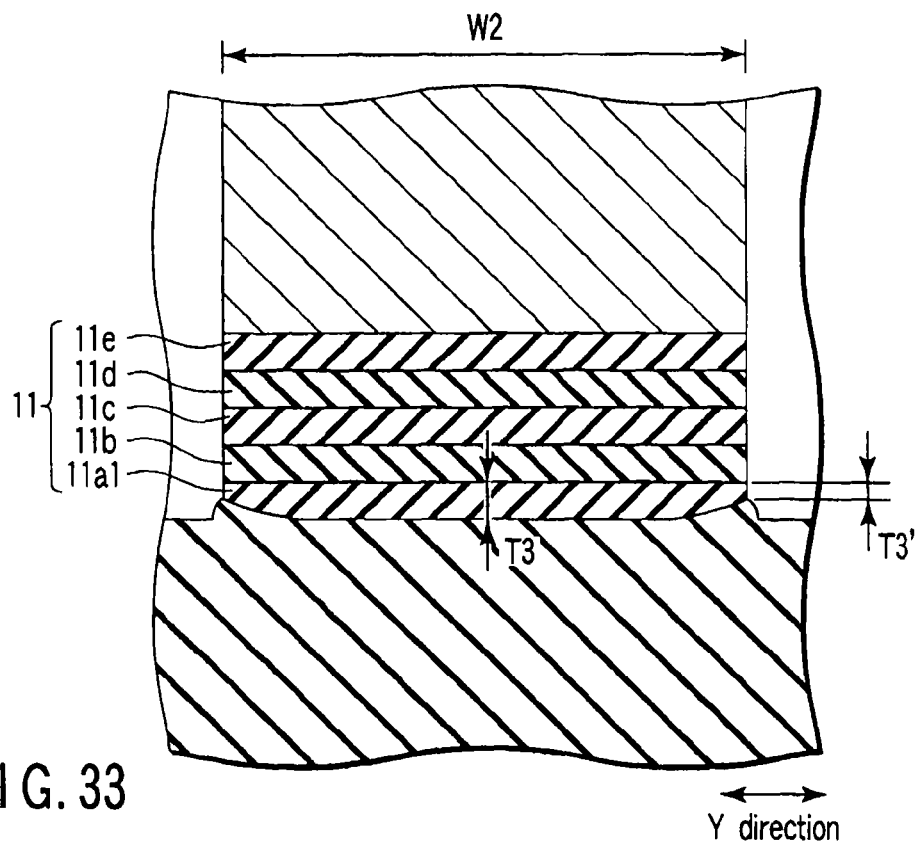
FIG. 33 is a sectional view showing the structure of the intergate insulating film of the peripheral transistor.

Furthermore, FIGS. 32 and 33 are Y-direction sectional views of the intergate insulating films 4A and 11 on the isolation insulating layers 6 and 13 in the memory cell and the peripheral transistor.

As shown in FIG. 32, no silicon nitride film serving as the lowermost layer of the intergate insulating film is present on the isolation insulating layer 6 in the memory cell.

On the other hand, as shown in FIG. 33, the end of the intergate insulating film 11 alone is oxidized in the peripheral transistor. Thus, a thickness T3' at the end of the silicon nitride film 11a1 serving as the lowermost layer of the intergate insulating film on the isolation insulating layer 13 is smaller than the thickness T3 in the center of the silicon nitride film 11a1.

Figure 34:
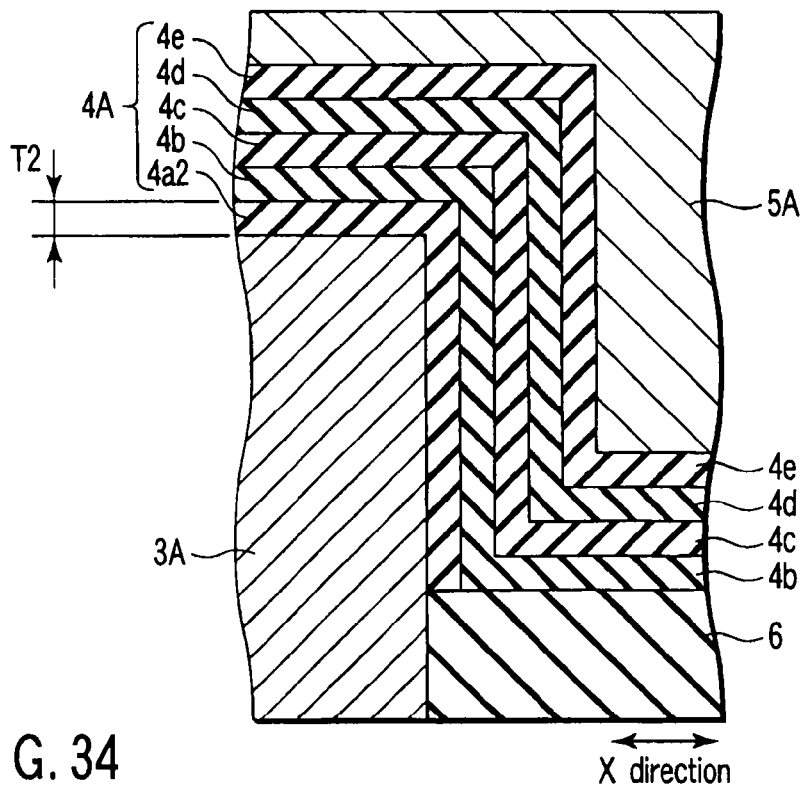
FIG. 34 is a sectional view showing the structure of the intergate insulating film of the memory cell.
Figure 35:
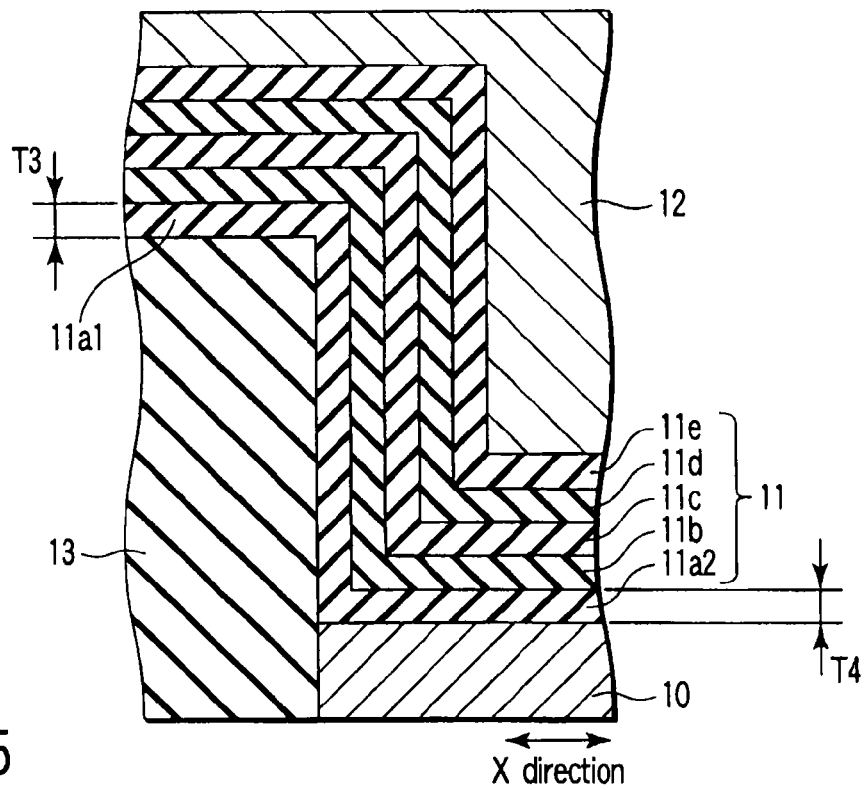
FIG. 35 is a sectional view showing the structure of the intergate insulating film of the peripheral transistor.

Furthermore, FIGS. 34 and 35 show the structures of the intergate insulating films 4A and 11 of the memory cell and the peripheral transistor in the case where the silicon nitride film serving as the lowermost layer of the gate insulating film is formed by the CVD method. In the present example, the thickness of the silicon nitride film serving as the lowermost layer of the intergate insulating film is reduced by the CVD method under the conditions where the thickness of the silicon nitride film is smaller than the thickness of the silicon nitride film formed under the CVD method conditions in the first embodiment.

In this case, the sidewall oxidizing process is carried out until the silicon nitride film on the isolation insulating layer 6 of the memory cell disappears, as in the case described above.

Therefore, as shown in FIG. 34, no silicon nitride film serving as the lowermost layer of the intergate insulating film 4A of the memory cell is present on the isolation insulating layer 6.

At this point, the silicon nitride film 11a1 serving as the lowermost layer of the intergate insulating film 11 of the peripheral transistor is formed at the thickness T3 on the isolation insulating layer 13 of the peripheral transistor.

Moreover, since the silicon nitride film 11a1 is a film formed by the CVD method, the thickness T3 of this silicon nitride film 11a1 is equal to the thickness T4 of the silicon nitride film 11a2 formed on the first gate electrode 10. In addition, the Y-direction structures of the intergate insulating films 4A and 11 on the isolation insulating layers 6 and 13 are the same as those in FIGS. 32 and 33.

As described above, no silicon nitride film serving as the lowermost layer of the intergate insulating film is disposed on the isolation insulating layer 6 of the memory cell, as shown in FIGS. 30 to 35. Moreover, the silicon nitride film 11a1 serving as the lowermost layer of the intergate insulating film 11 is formed at, for example, the thickness T3 on the isolation insulating layer 13 of the peripheral transistor.

Thus, no silicon nitride film on the isolation insulating layer is present in the memory cell, such that parasitic capacitance between adjacent floating gates of the memory cell is further reduced.

Therefore, the variation of a threshold voltage of the memory cell due to inter-cell interference can be suppressed.

On the other hand, the silicon nitride film on the isolation insulating layer can suppress the diffusion of a fixed charge into a semiconductor substrate in the peripheral transistor.

It is therefore possible to prevent the characteristic deterioration of the peripheral transistor due to the fixed charge.

3. Others

Examples of the present invention are not limited to the NAND type flash memory described in the embodiments, and can be applied to a nonvolatile semiconductor memory using a memory cell having a floating gate electrode, such as a NOR type or AND type flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
at least one memory cell disposed on a semiconductor substrate,
the memory cell having:
a first gate insulating film provided on a first element area of the semiconductor substrate, the first element area being defined by a first isolation insulating layer provided on the semiconductor substrate;
a charge storage layer provided on the first gate insulating film;
a first intergate insulating film having a multilayer structure and provided on the charge storage layer and the first isolation insulating layer; and
a control gate electrode provided on the first intergate insulating film; and
a peripheral transistor having:
a second gate insulating film provided on a second element area of the semiconductor substrate, the second element area being defined by a second isolation insulating layer provided on the semiconductor substrate;
a first gate electrode provided on the second gate insulating film and having a width larger than that of the charge storage layer;

a second intergate insulating film having a multilayer structure and provided on the first gate electrode and the second isolation insulating layer; and a second gate electrode provided on the second intergate insulating film, wherein the first intergate insulating film has n (n is natural number) layers on the charge storage layer and has m layers (m is natural number and m<n) on the first isolation insulating layer, and wherein the second intergate insulating film has n layers on the first gate electrode and an entire portion between the second isolation insulating layer and the second gate electrode in a direction perpendicular to a surface of the semiconductor substrate.

2. The nonvolatile semiconductor memory according to claim 1, wherein the first intergate insulating film includes a first portion disposed on an upper surface of the charge storage layer, a second portion disposed on the first isolation insulating layer, and a third portion disposed on a side surface of the charge storage layer, wherein a thickness of the third portion is larger than that of the first and second portion in a direction perpendicular to the surface of the semiconductor substrate.

3. The nonvolatile semiconductor memory according to claim 2, wherein the third portion has n layers.

4. The nonvolatile semiconductor memory according to claim 1, wherein the first intergate insulating film includes a first portion contacting an upper surface of the charge storage layer, a second portion contacting an upper surface of the first isolation insulating layer, and a third portion contacting a side surface of the charge storage layer, wherein the first portion has n layers and the second portion has m layers.

5. The nonvolatile semiconductor memory according to claim 4, wherein a thickness of the third portion is larger than that of the first and second portions in a direction perpendicular to a surface of the semiconductor substrate.

6. The nonvolatile semiconductor memory according to claim 4, wherein the third portion has n layers.

7. The nonvolatile semiconductor memory according to claim 1, wherein m is equal to n−1.

8. The nonvolatile semiconductor memory according to claim 1, wherein the second intergate insulating film includes a first portion disposed on the first gate electrode, a second portion disposed on an upper surface of the second isolation insulating layer, and a third portion disposed on a side surface of the second gate electrode, wherein the first portion and the second portion have n layers.

9. The nonvolatile semiconductor memory according to claim 8, wherein the third portion has n layers.

10. The nonvolatile semiconductor memory according to claim 1, wherein the second intergate insulating film includes a first portion contacting an upper surface of the first gate electrode, a second portion contacting an upper surface of the second isolation insulating layer, and a third portion contacting a side surface of the second isolation insulating layer, wherein the first portion and the second portion have n layers.

11. The nonvolatile semiconductor memory according to claim 10, wherein a thickness of the third portion is larger than that of the first and second portions in a direction perpendicular to a surface of the semiconductor substrate.

12. The nonvolatile semiconductor memory according to claim 10, wherein the third portion has n layers.

13. The nonvolatile semiconductor memory according to claim 1, wherein m is equal to n−1.

14. The nonvolatile semiconductor memory according to claim 1, wherein a thickness at an end of an insulating film serving as a lowermost layer of the second intergate insulating film contacting to the second isolation insulating layer is smaller than a thickness in a center of the insulating film serving as the lowermost layer of the second intergate insulating film contacting the second isolation insulating layer.

15. The nonvolatile semiconductor memory according to claim 1, wherein the first and second intergate insulating films having the multilayer structures include silicon nitride films and silicon oxide films.

16. The nonvolatile semiconductor memory according to claim 1, wherein the first and second intergate insulating films having the multilayer structures include silicon nitride films and high dielectric films.

* * * * *